(12) United States Patent
Yanagihara

(10) Patent No.: US 8,154,032 B2
(45) Date of Patent: Apr. 10, 2012

(54) ELECTROOPTICAL DEVICE, ELECTRONIC APPARATUS, AND METHOD FOR PRODUCING ELECTROOPTICAL DEVICE

(75) Inventor: Hirokazu Yanagihara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 629 days.

(21) Appl. No.: 12/170,892

(22) Filed: Jul. 10, 2008

(65) Prior Publication Data

US 2009/0026467 A1    Jan. 29, 2009

(30) Foreign Application Priority Data

Jul. 23, 2007  (JP) ................................. 2007-190434
Jul. 23, 2007  (JP) ................................. 2007-190437

(51) Int. Cl.
*H01L 33/08* (2010.01)
(52) U.S. Cl. ............ 257/88; 257/E33.001; 257/E33.007
(58) Field of Classification Search .................... 257/88, 257/E33.001, E33.007, 40, 72
See application file for complete search history.

(56) References Cited

U.S. PATENT DOCUMENTS

| 5,502,470 A * | 3/1996 | Miyashita et al. | 347/45 |
|---|---|---|---|
| 6,673,433 B1 * | 1/2004 | Saeki et al. | 428/323 |
| 7,214,960 B2 * | 5/2007 | Sano | 257/40 |
| 7,414,361 B2 | 8/2008 | Nozawa | |
| 7,477,014 B2 | 1/2009 | Mitsuya | |
| 7,671,527 B2 | 3/2010 | Katagami et al. | |
| 2005/0196526 A1 * | 9/2005 | Ishida | 427/66 |
| 2005/0264182 A1 * | 12/2005 | Seki | 313/503 |

FOREIGN PATENT DOCUMENTS

| CN | 1941403 A | 4/2007 |
|---|---|---|
| JP | A-2002-231445 | 8/2002 |
| JP | A-2003-187970 | 7/2003 |
| JP | A-2005-158494 | 6/2005 |
| JP | A-2005-285743 | 10/2005 |
| JP | A-2006-201423 | 8/2006 |
| JP | A-2006-228648 | 8/2006 |
| JP | A-2007-005056 | 1/2007 |

* cited by examiner

*Primary Examiner* — Thao Le
*Assistant Examiner* — Tanika Warrior
(74) *Attorney, Agent, or Firm* — Oliff & Berridge, PLC

(57) ABSTRACT

An electrooptical device having a plurality of light-emitting regions includes a substrate, a bank disposed in a region other than the light-emitting regions on the substrate so as to surround the light-emitting regions, and a functional layer disposed in openings surrounded by the bank. The bank includes an upper bank segment and a plurality of lower bank segments having a higher wettability than the upper bank segment. The number of the lower bank segments exposed is smaller in second regions of the openings than in first regions of the openings.

11 Claims, 17 Drawing Sheets

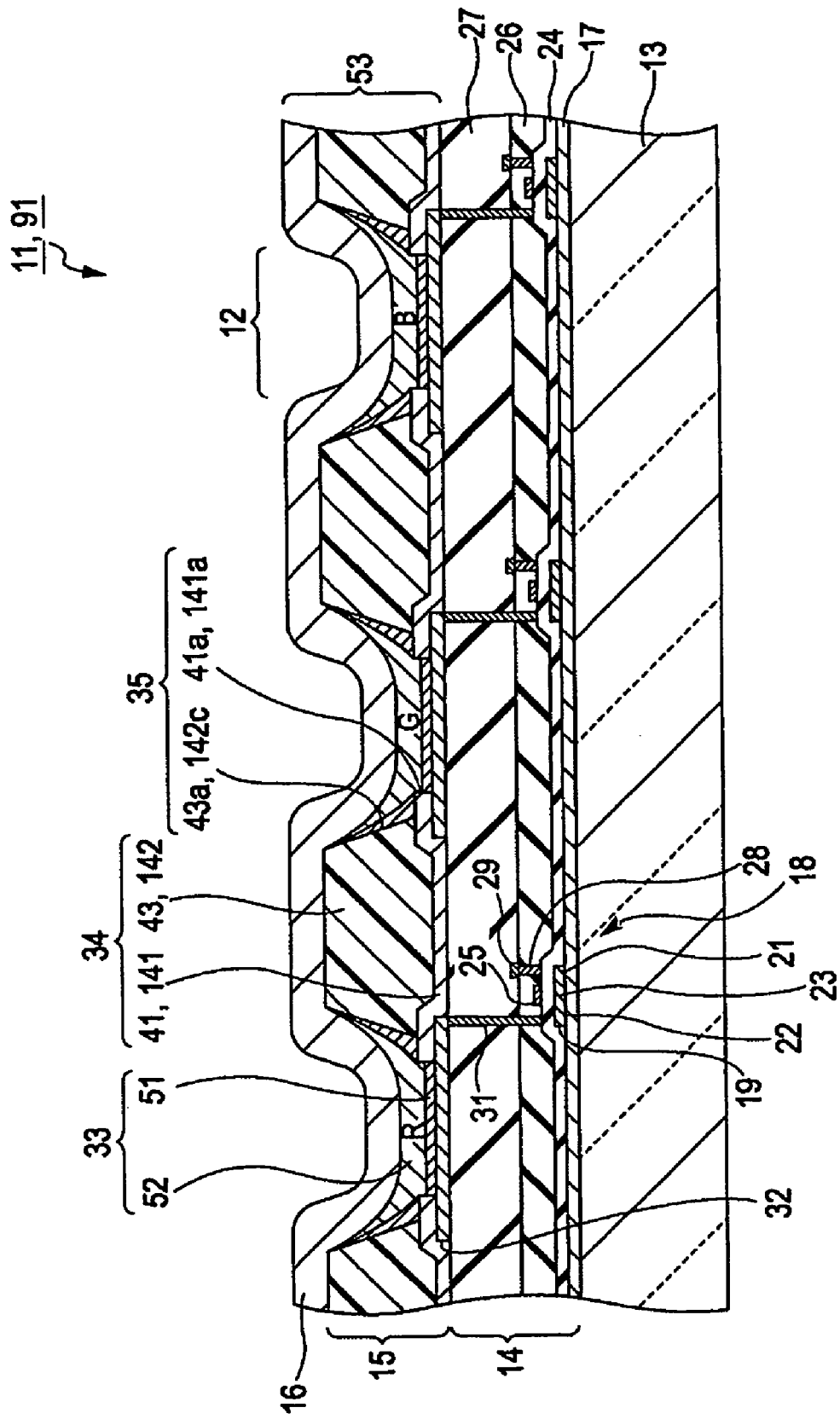

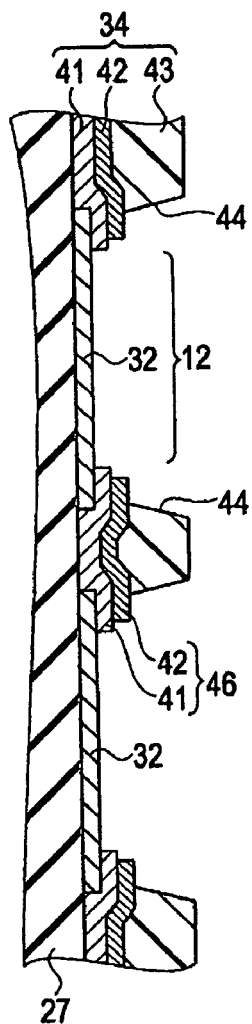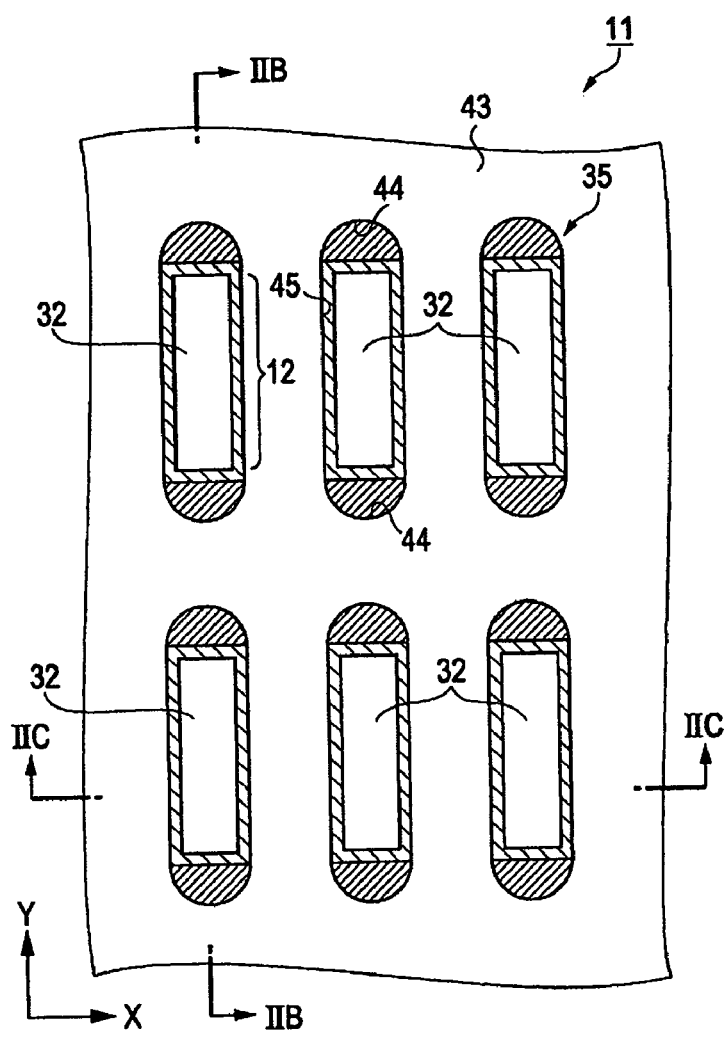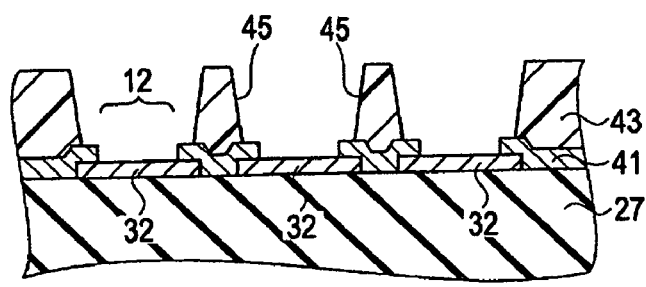

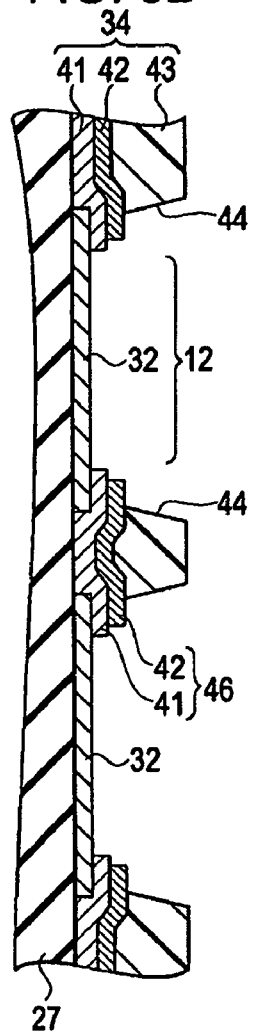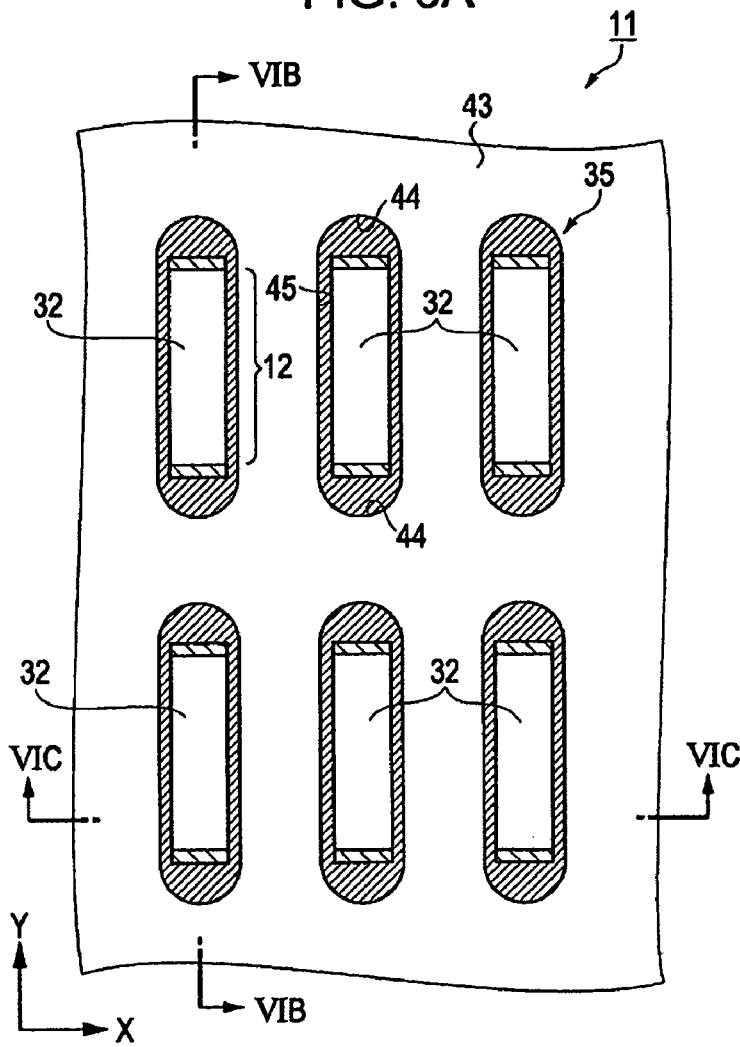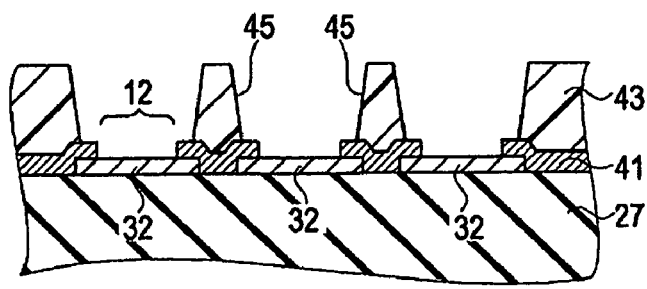

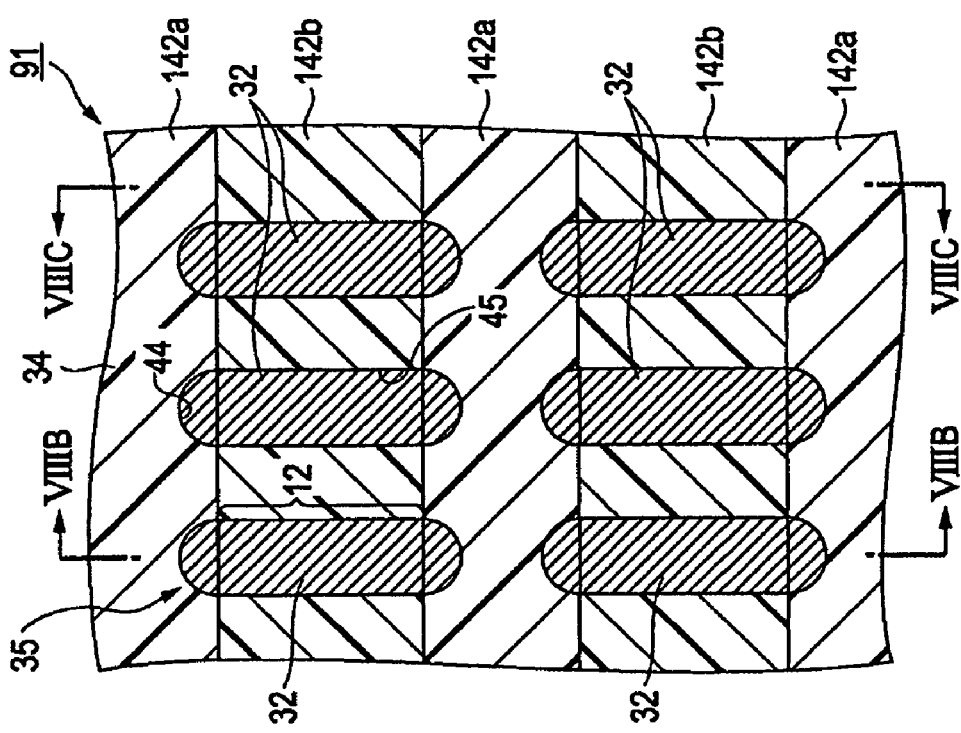
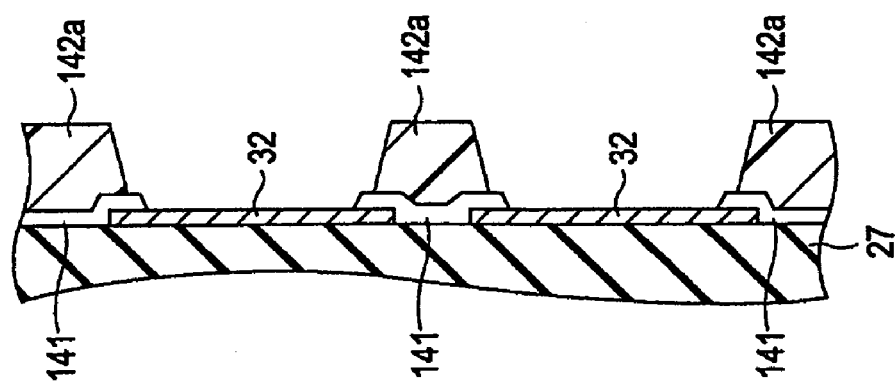

ELECTROOPTICAL DEVICE, ELECTRONIC APPARATUS, AND METHOD FOR PRODUCING ELECTROOPTICAL DEVICE

BACKGROUND

1. Technical Field

The present invention relates to an electrooptical device having a functional layer formed in openings of a bank, an electronic apparatus, and a method for producing an electrooptical device.

2. Related Art

An organic electroluminescent (EL) device is one type of electrooptical device. An organic EL device includes a light-emitting layer formed of a light-emitting material between an anode and a cathode. An example of a method for producing an organic EL device includes a step of ejecting an ink containing a light-emitting material into light-emitting regions on a substrate by ink jetting. The light-emitting regions are defined on the substrate by forming a bank for allowing predetermined portions to be filled with the ink using, for example, an organic material (such as acrylic resin).

The bank has, for example, track-shaped openings with long and short sides in the regions corresponding to the light-emitting regions. Such openings have a problem in that they are not readily filled with the ink inside arcs formed on the short sides because of poor ink wettability. This causes variations in the thickness of the ink ejected into the openings, thus preventing uniform light emission.

According to a method disclosed in JP-A-2005-158494, for example, two inorganic material layers (such as a silicon oxide film and a silicon nitride film) are formed under an acrylic resin bank such that the two layers are exposed in the form of steps (hereinafter referred to as a "bilayer bank"). The bilayer bank allows the openings of the bank to be filled with ink more readily. This known method improves ink wettability in the arc regions to form a film of uniform thickness in the openings.

In addition to the poor ink wettability inside the arcs formed on the short sides, as described above, the openings have a problem in that ink tends to spill over the long sides. This causes variations in the thickness of the ink ejected into the openings, thus preventing uniform light emission.

According to a method disclosed in JP-A-2003-187970, for example, an inorganic material layer (such as a silicon oxide film) is formed under an acrylic resin bank such that part of the layer is exposed. This layer allows the openings of the bank to be filled with ink more readily. This known method improves ink wettability to form a film of uniform thickness in the openings.

As the light-emitting regions are narrowed with increasing resolution, the size of the openings of the bank must be reduced accordingly. The bilayer bank, exposed on the sides of the openings in the width direction (on the long sides), can cause variations in the thickness of the ejected ink, depending on the accuracy of the amount of extension of the bilayer bank. This causes a problem in that light cannot be uniformly emitted (variations in light-emission characteristics). In addition, because the bilayer bank is formed in the form of steps, there is an increased amount of extension toward the light-emitting regions. This causes a problem in that the aperture ratio in the width direction of the openings is decreased.

As the light-emitting regions are narrowed (i.e., with increasing resolution), the curvature of the arcs is increased, and ink tends to recede from the arcs, particularly during a drying step. This makes it difficult to fill the light-emitting regions with ink. If the amount of ink is increased to ensure sufficient thickness, the ink tends to spill over the long sides. Thus, the contact angle with the ink differs between the long sides and the short sides, which therefore have variations in the thickness of the ink in the openings. This causes a problem in that light cannot be uniformly emitted (variations in light-emission characteristics).

SUMMARY

An electrooptical device, having a plurality of light-emitting regions, according to a first aspect of the invention includes a substrate, a bank disposed in a region other than the light-emitting regions on the substrate so as to surround the light-emitting regions, and a functional layer disposed in openings surrounded by the bank. The bank includes an upper bank segment and a plurality of lower bank segments having a higher wettability than the upper bank segment. The number of the lower bank segments exposed is smaller in second regions of the openings than in first regions of the openings.

With this structure, in which the lower bank segments are disposed at least in the first regions of the openings, the lower bank segments in the first regions can be wetted with liquid, so that the first regions can be filled with liquid. Hence, variations in liquid thickness can be suppressed in the light-emitting regions, and the functional layer, formed from a liquid, has suppressed variations in thickness, thus enabling uniform light emission in the light-emitting regions. In addition, variations in liquid thickness depending on the amount of extension of ends of the lower bank segments can be suppressed because the number of the lower bank segments exposed is smaller in the second regions. Furthermore, the aperture area of the second regions can be increased.

In the above electrooptical device, preferably, the openings have corners as viewed in a normal direction, and the first regions are regions including part of the corners of the openings.

With this structure, in which the lower bank segments are disposed at least in the regions including part of the corners, the lower bank segments in these regions can be wetted with liquid, so that the regions including part of the corners, which are not relatively readily filled with liquid, can be filled with liquid.

In the above electrooptical device, preferably, the openings have arcs as viewed in a normal direction, and the first regions are regions including part of the arcs of the openings.

With this structure, in which the lower bank segments are disposed at least in the regions including part of the arcs (for example, part of regions inside the arcs), the lower bank segments in these regions can be wetted with liquid, so that the regions including part of the arcs, which are not relatively readily filled with liquid, can be filled with liquid.

In the above electrooptical device, preferably, the openings have long sides and short sides as viewed in a normal direction, the first regions are regions on the short sides of the openings, and the second regions are regions on the long sides of the openings.

With this structure, the short-side regions (first regions) of the openings, which are narrower and are therefore less readily filled with liquid than the long-side regions, can be filled with liquid because the lower bank segments are disposed at least in the short-side regions. In addition, the aperture ratio in the width direction between the long sides can be increased because the number of the lower bank segments exposed is smaller in the long-side regions (second regions).

In the above electrooptical device, preferably, the lower bank segments include, in order from the substrate side, a first lower bank segment and a second lower bank segment, and the second lower bank segment has a smaller contact angle with liquid than the first lower bank segment.

With this structure, the ease of liquid filling can be increased in the first regions because the second lower bank segment, having a smaller contact angle with liquid than the first lower bank segment, is disposed in the first regions.

In the above electrooptical device, preferably, the first lower bank segment is a silicon oxide film, and the second lower bank segment is a silicon nitride film.

With this structure, the ease of liquid filling, insulation, and compatibility with surface treatment, for example, can be taken into consideration by selecting a silicon oxide film and a silicon nitride film, which has a higher wettability than a silicon oxide film, as the materials of the two lower bank segments.

In the above electrooptical device, preferably, the second lower bank segment is exposed in the first regions.

With this structure, the first regions, which are not relatively readily filled with liquid, can be filled with liquid because the second lower bank segment, having a higher wettability, is disposed in the first regions.

In the above electrooptical device, preferably, the first and second lower bank segments are exposed in the first regions, and one of the first and second lower bank segments is exposed in the second regions.

With this structure, the first regions, which are not relatively readily filled with liquid, can be filled with liquid because the two lower bank segments are disposed in the first regions. In addition, if only the first lower bank segment is disposed in the second regions, liquid can be efficiently used because the amount of unnecessary liquid deposited on the second lower bank segment, having a higher wettability, can be reduced as compared with the case where the second lower bank segment is disposed in the second regions. Furthermore, if only the second lower bank segment is disposed in the second regions, it allows the second regions to be wetted with ink more readily, thus increasing liquid flatness in the light-emitting regions.

An electrooptical device, having a plurality of light-emitting regions, according to a second aspect of the invention includes a substrate, a bank disposed in a region other than the light-emitting regions on the substrate so as to surround the light-emitting regions, and a functional layer disposed in openings surrounded by the bank. The bank includes an upper bank segment and a lower bank segment having a higher wettability than the upper bank segment. The lower bank segment is exposed in first regions of the openings but is not exposed in second regions of the openings.

With this structure, in which the lower bank segment is exposed in the first regions of the openings, the lower bank segment in the first regions can be wetted with liquid, so that the first regions can be filled with liquid. Hence, variations in liquid thickness can be suppressed in the light-emitting regions, and the functional layer, formed from a liquid, has suppressed variations in thickness, thus enabling uniform light emission in the light-emitting regions. In addition, variations in liquid thickness depending on the amount of extension of ends of the lower bank segment can be reduced because the lower bank segment is not exposed in the second regions. Furthermore, the aperture area of the second regions can be increased.

Preferably, the above electrooptical devices further include pixel electrodes, corresponding to the individual light-emitting regions, disposed on a surface of the substrate and a common electrode disposed opposite the pixel electrodes with the functional layer disposed therebetween, and the functional layer at least includes a light-emitting layer.

With this structure, the electrooptical devices, which are devices such as organic EL devices, having the pixel electrodes and the common electrode with the light-emitting layer disposed therebetween can uniformly emit light.

It is preferable that an electronic apparatus include one of the above electrooptical devices.

With this structure, an electronic apparatus that has an increased aperture ratio and that can uniformly emit light can be provided.

An electrooptical device, having a plurality of light-emitting regions, according to a third aspect of the invention includes a substrate, a bank disposed in at least part of a region other than the light-emitting regions on a surface of the substrate so as to surround the light-emitting regions, and a functional layer disposed in openings surrounded by the bank. The bank includes first portions and second portions. The first portions have a lower liquid repellency than the second portions.

With this structure, in which the first portions of the bank have a lower liquid repellency (higher wettability) than the second portions, the first portions can be wetted with liquid, so that regions of the openings inside the first portions can be filled with liquid. In addition, the liquid repellency of the second portions can prevent liquid from spilling out of regions of the openings inside the second portions. Hence, variations in liquid thickness can be suppressed in the light-emitting regions, and the functional layer, formed from a liquid, has suppressed variations in thickness, thus enabling uniform light emission in the light-emitting regions.

In the above electrooptical device, preferably, the openings have corners, and the first portions include part of the corners of the openings.

With this structure, the corners, which are not relatively readily filled with liquid, can be filled with liquid because the first portions, including part of the corners of the openings, have a lower liquid repellency (higher wettability). In addition, the liquid repellency of the second portions can prevent liquid from spilling out of the regions inside the second portions.

In the above electrooptical device, preferably, the openings have arcs, and the first portions include part of the arcs of the openings.

With this structure, regions of the openings inside the arcs, which are not relatively readily filled with liquid, can be filled with liquid because the first portions, including part of the arcs of the openings, have a lower liquid repellency (higher wettability).

In the above electrooptical device, preferably, the openings have long sides and short sides, the first portions include the short sides of the openings, and the second portions include the long sides of the openings.

With this structure, the regions inside the first portions, which are narrower and are therefore less readily filled with liquid than the regions inside the second portions, can be filled with liquid because the first portions, including the short sides, have a lower liquid repellency (higher wettability). In addition, the liquid repellency of the second portions can prevent liquid from spilling out of the regions inside the second portions.

In the above electrooptical device, preferably, the bank is formed of a bank material containing a photocatalytic material, the first portions are portions irradiated with energy, and the second portions are portions that are not irradiated with the energy.

With this structure, the bank material acts as a photocatalyst to decrease liquid repellency (increase lyophilicity) only in the portions irradiated with energy, namely, the first portions. The second portions, which are not irradiated with energy, have liquid repellency due to, for example, the structure of polysiloxane contained in the photocatalytic material. Thus, the first portions can be formed so as to have a lower liquid repellency, whereas the second portions can be formed so as to have a higher liquid repellency. As a result, the regions inside the first portions can be filled with liquid, whereas the liquid can be prevented from spilling out of the regions inside the second portions.

In the above electrooptical device, preferably, the first portions have a lower surface roughness than the second portions.

With this structure, in which the first portions have a lower surface roughness, the first portions can be wetted with liquid, so that the regions inside the first portions can be filled with liquid. In addition, the roughness of the second portions can prevent liquid from spilling out of the regions inside the second portions.

In the above electrooptical device, preferably, the contact angle of surfaces of the first portions with liquid is a first contact angle, and the contact angle of surfaces of the second portions with liquid is a second contact angle larger than the first contact angle.

With this structure, in which the first portions have a smaller contact angle with liquid than the second portions, the regions inside the first portions can be filled with liquid. In addition, because the second portions have a larger contact angle with liquid than the first portions, the liquid can be prevented from spilling out of the regions inside the second portions.

Preferably, the above electrooptical device further includes pixel electrodes, corresponding to the individual light-emitting regions, disposed on the surface of the substrate and a common electrode disposed opposite the pixel electrodes with the functional layer disposed therebetween, and the functional layer at least includes a light-emitting layer.

With this structure, the electrooptical device, which is a device such as an organic EL device, having the pixel electrodes and the common electrode with the light-emitting layer disposed therebetween has suppressed variations in the thickness of the light-emitting layer and can therefore uniformly emit light.

It is preferable that an electronic apparatus include the above electrooptical device.

With this structure, an electronic apparatus that can uniformly emit light can be provided.

A method according to an embodiment of the invention for producing an electrooptical device having a plurality of light-emitting regions includes forming pixel electrodes in the individual light-emitting regions on a substrate, forming a bank including first and second portions surrounding the pixel electrodes on the substrate, forming a light-emitting layer in openings surrounded by the bank on the pixel electrodes by droplet ejection, and forming a cathode opposite the pixel electrodes with the light-emitting layer disposed therebetween. The bank is formed so that the first portions have a lower liquid repellency than the second portions.

With this method, regions of the openings inside the first portions of the bank can be filled with liquid because the first portions are formed so that they have a lower liquid repellency (higher wettability) than the second portions. In addition, the liquid repellency of the second portions can prevent liquid from spilling out of regions of the openings inside the second portions. This suppresses variations in liquid thickness in the openings, thus enabling uniform light emission.

In the above method for producing an electrooptical device, preferably, the openings have corners, and the first portions include part of the corners of the openings.

With this method, the corners, which are not relatively readily filled with liquid, can be filled with liquid because the first portions, including part of the corners of the openings, have a lower liquid repellency (higher wettability). In addition, the liquid repellency of the second portions can prevent liquid from spilling out of the regions inside the second portions.

In the above method for producing an electrooptical device, preferably, the openings have arcs, and the first portions include part of the arcs of the openings.

With this method, regions of the openings inside the arcs, which are not relatively readily filled with liquid, can be filled with liquid because the first portions, including part of the arcs of the openings, have a lower liquid repellency (higher wettability).

In the above method for producing an electrooptical device, preferably, the openings have long sides and short sides, the first portions include the short sides of the openings, and the second portions include the long sides of the openings.

With this method, the regions inside the first portions, which are narrower and are therefore less readily filled with liquid than the regions inside the second portions, can be filled with liquid because the first portions, including the short sides, have a lower liquid repellency (higher wettability). In addition, the liquid repellency of the second portions can prevent liquid from spilling out of the regions inside the second portions.

In the above method for producing an electrooptical device, preferably, the formation of the bank includes coating the pixel electrodes with a coating liquid containing a photocatalytic material, forming a bank layer by drying the coating liquid, forming the openings in regions of the bank layer corresponding to the light-emitting regions by patterning the bank layer into the pattern of the bank, and irradiating third regions of the bank with energy to form the first portions.

With this method, the bank material (titanium oxide) acts as a photocatalyst to decrease liquid repellency (increase lyophilicity) only in the portions irradiated with energy, namely, the first portions. The second portions of the bank, which are not irradiated with energy, have liquid repellency due to, for example, the structure of polysiloxane contained in the photocatalytic material. Thus, the bank can be formed so that it includes the third regions, having a lower liquid repellency, and fourth regions having a higher liquid repellency. As a result, regions of the openings inside the third regions can be filled with liquid, whereas the liquid can be prevented from spilling out of regions of the openings inside the fourth regions.

In the above method for producing an electrooptical device, preferably, the formation of the bank includes forming the second portions with a second material and forming the first portions with a first material having a lower liquid repellency than the second material.

With this method, the regions inside the first portions can be filled with liquid because the first portions are formed of the first material, which has a lower liquid repellency than the second material constituting the second portions. In addition, the liquid repellency of the second portions, formed of the second material, can prevent liquid from spilling out of the regions inside the second portions.

In the above method for producing an electrooptical device, preferably, the formation of the bank includes forming the first portions, having a lower liquid repellency, by subjecting third regions of the bank, formed of an organic material, to plasma treatment and forming the second portions, having a higher liquid repellency, by subjecting fourth regions of the bank to plasma treatment for a longer plasma treatment time than the third regions.

With this method, in which the time for the plasma treatment (for example, $CF_4$ plasma treatment) of the fourth regions is longer than the time for the plasma treatment (for example, $O_2$ plasma treatment) of the third regions, the fourth regions can have a higher liquid repellency. Thus, the regions inside the first portions can be filled liquid. In addition, the liquid repellency of the second portions can prevent liquid from spilling out of the regions inside the second portions.

BRIEF DESCRIPTION OF THE DRAWINGS

The invention will be described with reference to the accompanying drawings, wherein like numbers reference like elements.

FIG. 1 is a schematic sectional view showing the structure of part of an organic EL device according to a first embodiment.

FIGS. 2A to 2C are schematic diagrams showing the structure of a bank in the organic EL device: FIG. 2A is a schematic plan view of the organic EL device as viewed from above; FIG. 2B is a schematic sectional view, taken along line IIB-IIB of FIG. 2A, of the organic EL device; and FIG. 2C is a schematic sectional view, taken along line IIC-IIC of FIG. 2A, of the organic EL device.

FIG. 5A is a schematic plan view of the organic EL device as viewed from above; FIG. 5B is a schematic sectional view, taken along line VB-VB of FIG. 5A, of the organic EL device; and FIG. 5C is a schematic sectional view, taken along line VC-VC of FIG. 5A, of the organic EL device.

FIGS. 6A to 6C are schematic diagrams showing the structure of a bank in an organic EL device according to a third embodiment: FIG. 6A is a schematic plan view of the organic EL device as viewed from above; FIG. 6B is a schematic sectional view, taken along line VIB-VIB of FIG. 6A, of the organic EL device; and FIG. 6C is a schematic sectional view, taken along line VIC-VIC of FIG. 6A, of the organic EL device.

FIG. 7A is a schematic plan view of the organic EL device as viewed from above; FIG. 7B is a schematic sectional view, taken along line VIIB-VIIB of FIG. 7A, of the organic EL device; and FIG. 7C is a schematic sectional view, taken along line VIIC-VIIC of FIG. 7A, of the organic EL device.

FIGS. 8A to 8C are schematic diagrams showing the structure of a bank in an organic EL device according to a fifth embodiment: FIG. 8A is a schematic plan view of the organic EL device as viewed from above; FIG. 8B is a schematic sectional view, taken along line VIIIB-VIIIB of FIG. 8A, of the organic EL device; and FIG. 8C is a schematic sectional view, taken along line VIIIC-VIIIC of FIG. 8A, of the organic EL device.

FIG. 12A is a schematic plan view of the bank as viewed from above; FIG. 12B is a schematic sectional view, taken along line XIIB-XIIB of FIG. 12A, of the bank; and FIG. 12C is a schematic sectional view, taken along line XIIC-XIIC of FIG. 12A, of the bank.

FIG. 13A is a schematic plan view of the bank as viewed from above; FIG. 13B is a schematic sectional view, taken along line XIIIB-XIIIB of FIG. 13A, of the bank; and FIG. 13C is a schematic sectional view, taken along line XIIIC-XIIIC of FIG. 13A, of the bank.

FIG. 14A is a schematic plan view of the bank as viewed from above; FIG. 14B is a schematic sectional view, taken along line XIVB-XIVB of FIG. 14A, of the bank; and FIG. 14C is a schematic sectional view, taken along line XIVC-XIVC of FIG. 14A, of the bank.

FIG. 18A is a schematic plan view of the bank as viewed from above; FIG. 18B is a schematic sectional view, taken along line XVIIIB-XVIIIB of FIG. 18A, of the bank; and FIG. 18C is a schematic sectional view, taken along line XVIIIC-XVIIIC of FIG. 18A, of the bank.

DESCRIPTION OF EXEMPLARY EMBODIMENTS

Figure 3:
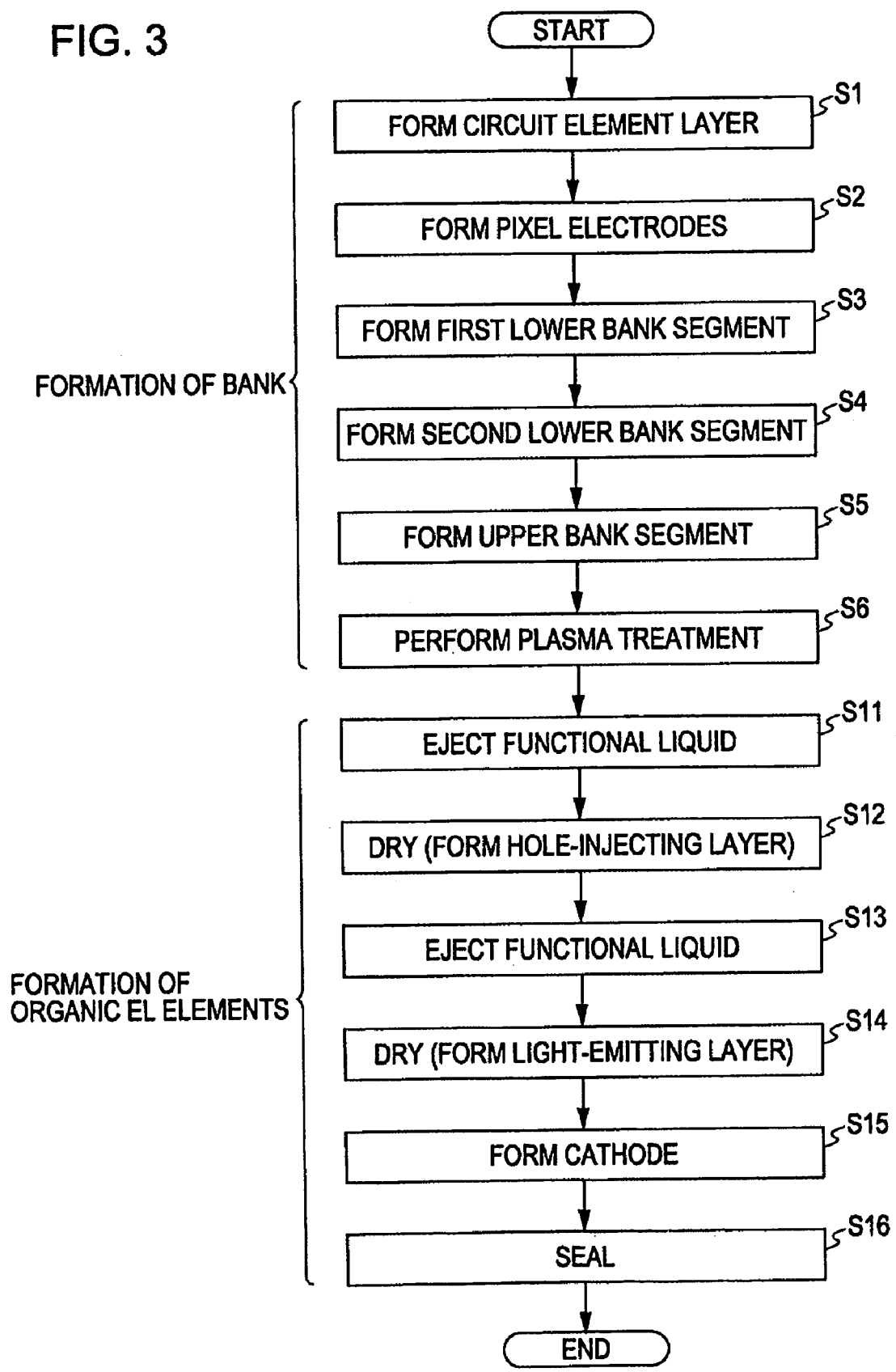
FIG. 3 is a flowchart of a method for producing the organic EL device.

Embodiments of the invention will now be described with reference to the drawings.

First Embodiment

FIG. 1 is a schematic sectional view showing the structure of part of an organic EL device as an electrooptical device according to the first embodiment. FIGS. 2A to 2C are schematic diagrams showing the structure of a bank in the organic EL device after a step of forming the bank. FIG. 2A is a schematic plan view of the organic EL device as viewed from above. FIG. 2B is a schematic sectional view, taken along line IIB-IIB of FIG. 2A, of the organic EL device. FIG. 2C is a schematic sectional view, taken along line IIC-IIC of FIG. 2A, of the organic EL device. FIG. 1 shows the positional relationship between individual components in cross section, where the relative relationship is not taken into consideration. The structure of the organic EL device will now be described with reference to FIGS. 1 and 2A to 2C.

Referring to FIG. 1, an organic EL device 11 emits light from light-emitting regions 12. The organic EL device 11 includes a substrate 13, a circuit element layer 14 on the substrate 13, a light-emitting element layer 15 on the circuit element layer 14, and a cathode (common electrode) 16 on the light-emitting element layer 15. The substrate 13 used is, for example, a transparent glass substrate (hereinafter referred to as the "glass substrate 13").

The circuit element layer 14 includes an underlying protective film 17 formed of a silicon oxide ($SiO_2$) film on the glass substrate 13 and thin-film transistors (TFTs) 18 on the underlying protective film 17. Specifically, semiconductor films 19 formed of polysilicon films are arranged in an island-like pattern on the underlying protective film 17. The semiconductor films 19 have source regions 21 and drain regions 22 formed by impurity doping. The undoped regions are channel regions 23.

The circuit element layer 14 also includes a gate insulating film 24 covering the underlying protective film 17 and the semiconductor films 19, gate electrodes 25 (scanning lines) on the gate insulating film 24, and a first interlayer insulating film 26 and a second interlayer insulating film 27 on the gate insulating film 24 and the gate electrodes 25. The gate insulating film 24 is formed of a transparent film such as a silicon oxide film. The gate electrodes 25 are formed of, for example, aluminum (Al), molybdenum (Mo), tantalum (Ta), titanium (Ti), or tungsten (W). The interlayer insulating films 26 and 27 are formed of a transparent film such as a silicon oxide ($SiO_2$) film or a titanium oxide ($TiO_2$) film. The gate electrodes 25 are disposed at the positions corresponding to the channel regions 23 of the semiconductor films 19.

The source regions 21 of the semiconductor films 19 are electrically connected to signal lines 29 on the first interlayer insulating film 26 via contact holes 28 extending through the first interlayer insulating film 26 and the gate insulating film 24. The drain regions 22 are electrically connected to pixel electrodes 32 on the second interlayer insulating film 27 via contact holes 31 extending through the second interlayer insulating film 27, the first interlayer insulating film 26, and the gate insulating film 24.

The pixel electrodes 32 are provided in the individual light-emitting regions 12. The pixel electrodes 32 are formed of a transparent indium tin oxide (ITO) film and have, for example, a substantially rectangular shape in plan view (see FIG. 2). The circuit element layer 14 also includes hold capacitors and switching transistors (not shown). Thus, the circuit element layer 14 forms drive transistors connected to the individual pixel electrodes 32.

The light-emitting element layer 15 is provided on the glass substrate 13 and includes light-emitting elements arranged in a matrix. Specifically, the light-emitting element layer 15 mainly includes functional layers 33 on the pixel electrodes 32 and a bank 34 partitioning the functional layers 33. The cathode 16 is disposed on the functional layers 33. The pixel electrodes 32, the functional layers 33, and the cathode 16 constitute the light-emitting elements.

The bank 34 has openings 35 that are, for example, track-shaped in plan view (see FIG. 2A). Specifically, the openings 35 of the bank 34 include the light-emitting regions 12, having long and short sides, and arc 44 regions, corresponding to first regions, on the short sides (Y direction) of the light-emitting regions 12. The arc 44 regions, also called arc-side regions, refer to regions surrounded by the arcs 44 in the openings 35.

In the arc 44 regions of the openings 35, a first lower bank segment 41, a second lower bank segment 42, and an upper bank segment 43 are stacked in the above order from the glass substrate 13 side such that their ends are exposed in the form of steps (see FIG. 2B).

To ensure insulation between the adjacent pixel electrodes 32, the first lower bank segment 41 is formed so as to cover the peripheries of the pixel electrodes 32. That is, the first lower bank segment 41 overlaps the pixel electrodes 32 in plan view. The first lower bank segment 41 is formed of, for example, a silicon oxide ($SiO_2$) film, which is an inorganic material.

The second lower bank segment 42 is formed on the first lower bank segment 41 to improve wettability to a functional liquid (for example, an ink for hole-transporting layers 51). The second lower bank segment 42 is formed of a material with a higher wettability than a silicon oxide film, for example, a silicon nitride (SiN) film, which is also an inorganic material. A silicon nitride film also has a higher dielectric constant than a silicon oxide film.

The upper bank segment 43 is formed on the first lower bank segment 41 and the second lower bank segment 42 to partition the functional layers 33. The upper bank segment 43 is formed of an acrylic resin, which is an organic material. The upper bank segment 43 has, for example, a trapezoidal shape with inclined surfaces in cross section.

In straight line 45 regions (on the long sides), corresponding to second regions, of the openings 35, the first lower bank segment 41 and the upper bank segment 43 are stacked in the above order from the glass substrate 13 side such that their ends are exposed in the form of steps (see FIG. 2C). The straight line 45 regions, also called straight-side regions, refer to regions covering the straight sides and the light-emitting regions 12 in the openings 35. The second lower bank segment 42 is not exposed in the straight-side regions. The materials of the first lower bank segment 41 and the upper bank segment 43, for example, are the same as above.

Because the second lower bank segment 42, formed of a film with high wettability, namely, a silicon nitride film, is stacked on the first lower bank segment 41 in the arc 44 regions of the openings 35, the second lower bank segment 42 can be wetted with ink so that the arc 44 regions, which are not relatively readily filled with ink, can be filled with ink.

In addition, the number of the lower bank segments 46 is one layer smaller in the straight line 45 regions of the openings 35 than in the arc 44 regions; that is, only the first lower bank segment 41 is formed in the straight line 45 regions. This reduces variations in the amount of extension of the lower bank segments 46 into the light-emitting regions 12, thus ensuring uniform ink thickness. Furthermore, because only the first lower bank segment 41 is formed as the lower bank segments 46, the aperture ratio of these regions (regions in the X direction) can be increased.

The term "high wettability" refers to a relatively small contact angle with ink. Hence, the arc-side regions, which have increased wettability (see FIG. 2A), can more readily be filled with ink.

The functional layers 33, including hole-injecting layers 51 and light-emitting layers 52, for example, are provided in regions surrounded by the bank 34, that is, the openings 35 (light-emitting regions 12). The hole-injecting layers 51 are disposed in recesses whose bottoms are defined by the pixel electrodes 32 and whose sidewalls are defined by the bank 34 (41, 42, and 43) (see FIGS. 2B and 2C).

The hole-injecting layers 51 are formed of a conductive polymer layer formed of a conductive polymer material containing a dopant. The hole-injecting layers 51 can be formed of, for example, polystyrene sulfonic acid-doped 3,4-polyethylenedioxythiophene (PEDOT-PSS).

With the second lower bank segment 42 formed in the arc 44 regions, the openings 35 can readily be wetted (filled) inside the arcs 44 with, for example, a functional liquid ejected to form the hole-injecting layers 51. The hole-injecting layers 51 can therefore be easily formed in the openings 35 with uniform thickness.

The light-emitting layers 52, which are layers of organic light-emitting materials that cause electroluminescence, are provided on the hole-injecting layers 51.

The cathode 16 is provided on the light-emitting layers 52 and the upper bank segment 43. In other words, the cathode 16 is provided on the side of the light-emitting layers 52 facing away from the pixel electrodes 32. The cathode 16 is, for example, a laminate of calcium (Ca) and aluminum (Al) films. A sealing member (not shown) formed of, for example, resin is stacked on the cathode 16 to prevent intrusion of moisture and oxygen. The light-emitting element layer 15 and the cathode 16 constitute display elements 53.

The light-emitting layers 52, as described above, are layers of organic light-emitting materials that cause electroluminescence. A voltage applied across the pixel electrodes 32 and the cathode 16 causes the hole-injecting layers 51 to inject holes into the light-emitting layers 52 and the cathode 16 to inject electrons into the light-emitting layers 52. The light-emitting layers 52 emit light when the holes and the electrons combine together.

In the organic EL device 11, for example, light emitted from the functional layers 33 toward the glass substrate 13 passes through the circuit element layer 14 and the glass substrate 13 to exit from the bottom of the glass substrate 13. At the same time, light emitted from the functional layers 33 toward the side opposite the glass substrate 13 is reflected by the cathode 16 before passing through the circuit element layer 14 and the glass substrate 13 to exit from the bottom of the glass substrate 13. The light can exit from the cathode 16 if the cathode 16 is formed of a transparent material.

FIG. 3 is a flowchart of a method for producing the organic EL device 11. The method for producing the organic EL device 11 will now be described with reference to FIGS. 1 to 3.

Referring to FIG. 3, the method for producing the organic EL device 11 includes Steps S1 to S6, through which a bank is formed, and Steps S11 to S16, through which organic EL elements are formed. In Step S1, first, the circuit element layer 14 is formed on the glass substrate 13 by a known film-deposition technique. In Step S2, the pixel electrodes 32 are formed on the circuit element layer 14 using ITO.

In Step S3, the first lower bank segment 41 is formed on the circuit element layer 14 and the pixel electrodes 32. Specifically, a first lower bank segment layer, for example, a silicon oxide ($SiO_2$) layer, is formed over the circuit element layer 14 and the pixel electrodes 32 as the material of the first lower bank segment 41 by a method such as chemical vapor deposition (CVD). The first lower bank segment layer is then patterned by photolithography and etching to form openings 41a (see FIG. 1) in regions corresponding to the light-emitting regions 12.

In Step S4, the second lower bank segment 42 is formed on the first lower bank segment 41. To form the second lower bank segment 42, specifically, a silicon nitride film is formed over the glass substrate 13, including the first lower bank segment 41. The silicon nitride film can be formed by, for example, vapor deposition. The silicon nitride film is then patterned by photolithography and etching so that the second lower bank segment 42 is exposed only in the arc-side regions of the openings 35.

In Step S5, the upper bank segment 43 is formed on the second lower bank segment 42. To form the upper bank segment 43, specifically, an acrylic resin film is formed over the glass substrate 13, including the first lower bank segment 41 and the second lower bank segment 42. The acrylic resin film can be formed by, for example, vapor deposition. The acrylic resin film is then patterned by photolithography and etching to form openings 43a (see FIG. 1) in the regions corresponding to the light-emitting regions 12.

After the above steps, the first lower bank segment 41 and the second lower bank segment 42 are exposed in the form of steps under the upper bank segment 43 in the arc 44 regions of the openings 35. In the straight line 45 regions of the openings 35, only the first lower bank segment 41 is exposed under the upper bank segment 43.

In Step S6, the bank 34 is subjected to plasma treatment. The first lower bank segment 41 and the second lower bank segment 42 are subjected to, for example, oxygen plasma treatment using oxygen ($O_2$) gas. The upper bank segment 43 is subjected to, for example, carbon tetrafluoride ($CF_4$) plasma treatment using tetrafluoromethane.

Specifically, the first lower bank segment 41 and the second lower bank segment 42 may be subjected to, for example, oxygen plasma treatment at a plasma power of 100 to 800 kW, an oxygen gas flow rate of 50 to 100 ml/min, a substrate transportation speed of 0.5 to 10 mm/sec, and a substrate temperature of 70° C. to 90° C., so that the first lower bank segment 41 and the second lower bank segment 42 become lyophilic (less liquid-repellent).

The upper bank segment 43, on the other hand, may be subjected to, for example, carbon tetrafluoride plasma treatment at a plasma power of 100 to 800 kW, a tetrafluoromethane gas flow rate of 50 to 100 ml/min, a substrate transportation speed of 0.5 to 10 mm/sec, and a substrate temperature of 70° C. to 90° C., so that the upper bank segment 43 becomes liquid-repellent (more liquid-repellent).

The bank 34 is thus finished, with the second lower bank segment 42 having an ink contact angle of 30° and the upper bank segment 43 having an ink contact angle of 90°. The second lower bank segment 42, formed in the arc 44 regions, allows the arc 44 regions to be wetted with ink. At the same time, the upper bank segment 43, having a large contact angle, can prevent ink from spilling out of the straight-side regions.

In Step S11, subsequently, a functional liquid containing the material of the hole-injecting layers 51 is ejected into the light-emitting regions 12, surrounded by the bank 34, on the pixel electrodes 32 by droplet ejection (for example, ink jetting). Specifically, droplets of the functional liquid are ejected into the recesses whose bottoms are defined by the pixel electrodes 32 and whose sidewalls are defined by the bank 34 (41, 42, and 43). The functional liquid for the hole-injecting layers 51 may be, for example, a PEDOT-PSS dispersion. An example of the PEDOT-PSS dispersion used is one containing PEDOT and PSS in a weight ratio of 1:10, having a solid content of 0.5%, and containing 50% diethylene glycol, with the balance being pure water.

In Step S12, the functional liquid is dried to form the hole-injecting layers 51. Specifically, the functional liquid is dried or fired in a high-temperature environment to evaporate the solvent and thereby solidify the PEDOT-PSS contained in the functional liquid, thus forming the hole-injecting layers 51 in the openings 35. The functional liquid may be dried by, for example, keeping the glass substrate 13 in an environment at 200° C. for ten minutes. The hole-injecting layers 51 thus formed have a thickness of, for example, 50 nm.

In Step S13, functional liquids containing the materials of the light-emitting layers 52 are ejected onto the hole-injecting layers 51 by droplet ejection. An example of the functional liquids for the light-emitting layers 52 is one containing a red fluorescent material in a solid content of 0.8% and cyclohexylbenzene as a solvent.

As described above, because the first lower bank segment 41 and the second lower bank segment 42, which has a higher wettability, are formed in the form of steps in the arc 44 regions of the openings 35, the second lower bank segment 42 can be wetted with ink so that the arc 44 regions (short-side regions), which are not relatively readily filled with ink, can be filled with ink. In addition, the ink can be dried without receding, so that the light-emitting layers 52 in the openings 35 can have uniform thickness. Furthermore, because the regions inside the arcs 44 are separated from the light-emitting regions 12, the aperture ratio is not decreased even if the first lower bank segment 41 and the second lower bank segment 42 are formed.

In Step S14, the functional liquids are dried to form the light-emitting layers 52. Specifically, the functional liquids are dried or fired in a high-temperature environment to evaporate the solvent and thereby solidify the materials contained in the functional liquids, thus forming the light-emitting layers 52. The functional liquids may be dried by, for example, keeping the glass substrate 13 in an environment at 100° C. for one hour. The light-emitting layers 52 thus formed have a thickness of, for example, 100 nm. The light-emitting layers 52 have a larger area than the hole-injecting layers 51 so that relatively flat regions of the light-emitting layers 52 can be used for light emission.

In Step S15, a calcium film and an aluminum film are formed in the above order over substantially the entire surface of the glass substrate 13, on which the light-emitting layers 52 have been formed, by a method such as vapor deposition, thus forming the cathode 16. The calcium film thus formed has a thickness of, for example, 5 nm. The aluminum film thus formed has a thickness of, for example, 300 nm.

In Step S16, the top of the cathode 16 is sealed with an adhesive and a glass substrate to form organic EL elements, thus finishing the organic EL device 11.

Figure 4:
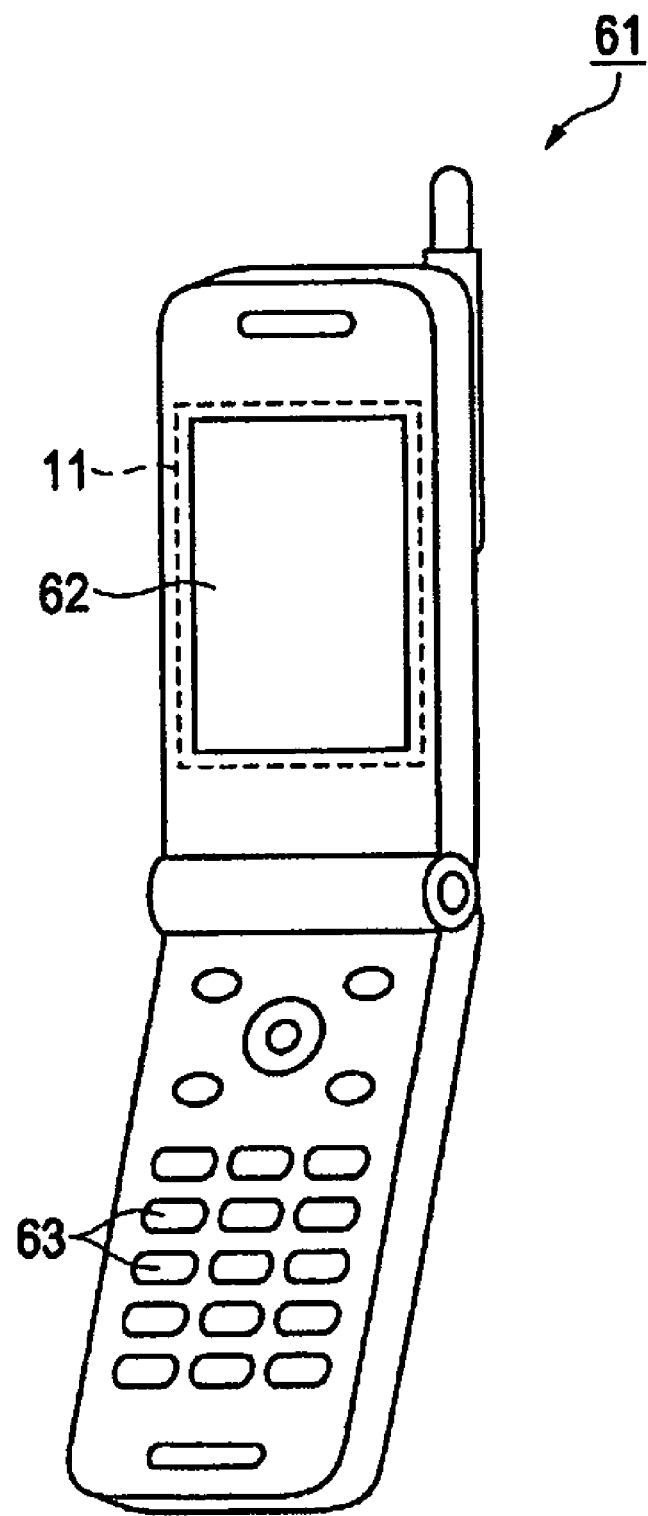
FIG. 4 is a schematic diagram showing a cellular phone including the organic EL device.

FIG. 4 is a schematic diagram showing a cellular phone as an example of an electronic apparatus including the above organic EL device 11. The cellular phone including the organic EL device 11 will now be described with reference to FIG. 4.

Referring to FIG. 4, a cellular phone 61 includes a display unit 62 and operating buttons 63. The display unit 62 incorporates the organic EL device 11, which can, for example, uniformly emit light, thus providing a high-quality display. In addition to cellular phones, the organic EL device 11 can be applied to various electronic apparatuses, including mobile computers, digital cameras, digital camcorders, car-mounted equipment, and audio equipment.

As described in detail above, the first embodiment provides the following advantages.

(1) According to the first embodiment, the second lower bank segment 42, formed of a film with high wettability, namely, a silicon nitride film, is provided on the first lower bank segment 41 in the arc 44 regions. The second lower bank segment 42 allows the arc 44 regions, which are not readily filled with ink, to be filled with ink when the ink is ejected into the openings 35. This ensures uniform ink thickness in the openings 35, thus enabling uniform light emission.

(2) According to the first embodiment, only the first lower bank segment 41 is formed in the straight line 45 regions. In this case, variations in film thickness depending on the amount of extension of the lower bank segments 46 into the light-emitting regions 12 can be reduced as compared with the case where the two lower bank segments 46 are formed in the straight line 45 regions. This ensures uniform ink thickness in the openings 35, thus enabling uniform light emission. In addition, because only the first lower bank segment 41 is formed as the lower bank segments 46, the aperture ratio of the narrow regions between the straight lines 45 (in the X direction) can be increased. Furthermore, the first lower bank segment 41 is formed of a silicon oxide film, whose wettability is lower than that of a silicon nitride film but is fairly high, so that the wettability allows the straight-side regions to be filled with ink.

(3) According to the first embodiment, because only one lower bank segment 46 is formed in the straight line 45 regions, the aperture width of these regions (X direction) can be increased. This allows ejected ink to be spread over a wider area, thus preventing the ink from spilling out of the straight-side regions.

Second Embodiment

Figure 5B:
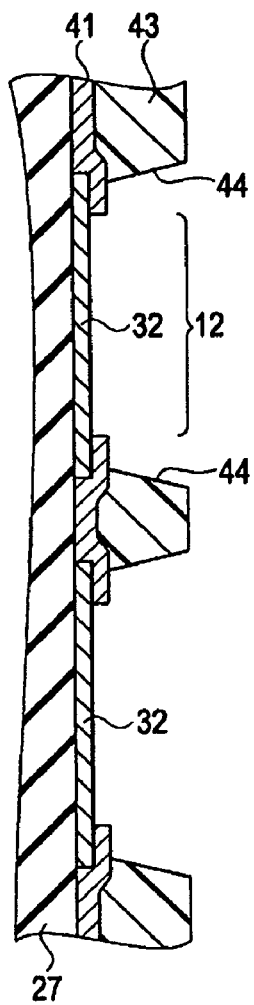
FIGS. 5A to 5C are schematic diagrams showing the structure of a bank in an organic EL device according to a second embodiment.
Figure 5A:
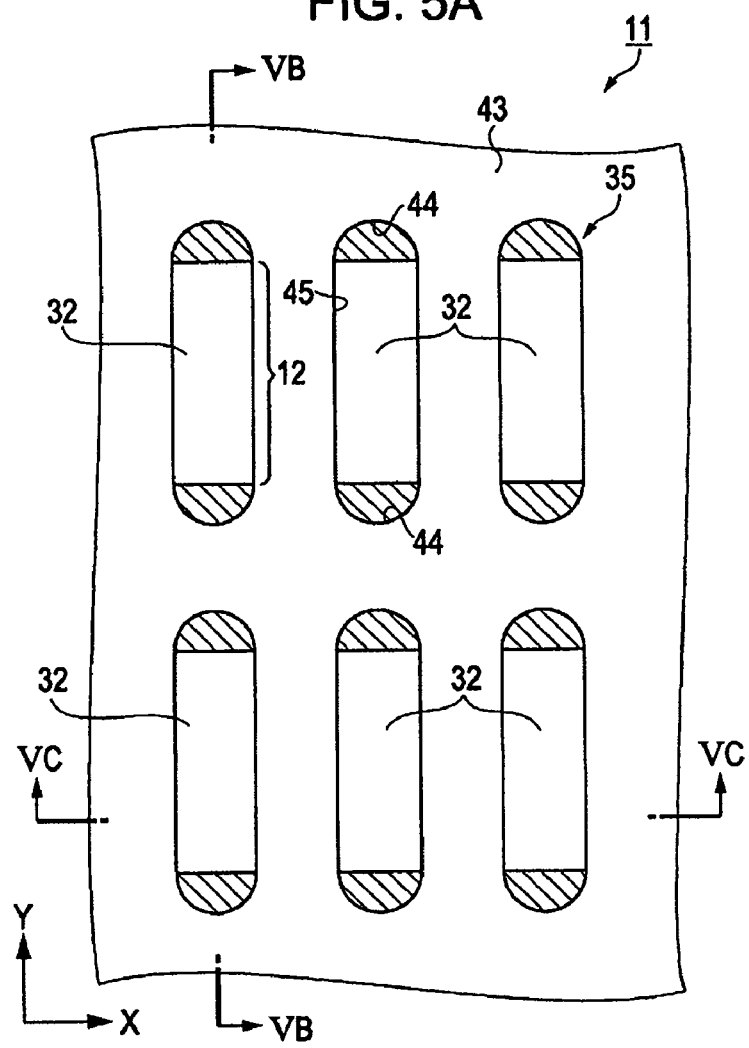
Figure 5C:
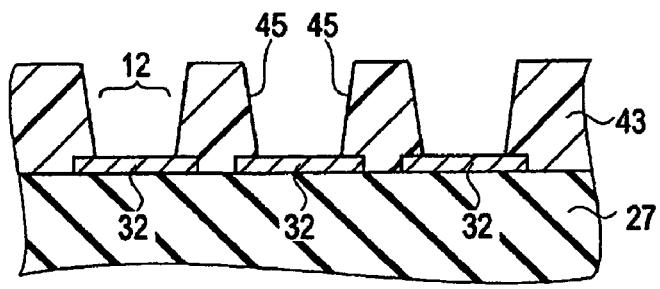

FIGS. 5A to 5C are schematic diagrams showing the structure of a bank in an organic EL device according to the second embodiment. FIG. 5A is a schematic plan view of the bank as viewed from above. FIG. 5B is a schematic sectional view, taken along line VB-VB of FIG. 5A, of the bank. FIG. 5C is a schematic sectional view, taken along line VC-VC of FIG. 5A, of the bank. The structure of the bank will now be described with reference to FIGS. 5A to 5C. The bank structure of the second embodiment differs from that of the first embodiment in that the first lower bank segment is formed under the upper bank segment in the arc-side regions and no lower bank segment is formed in the straight-side regions. The same components as used in the first embodiment are denoted by the same reference numerals, and a description thereof will be omitted or condensed.

Referring to FIGS. 5A to 5C, in the arc 44 regions of the openings 35, the first lower bank segment 41 and the upper bank segment 43 are stacked in the form of steps in the above order from the glass substrate 13 side. In the straight line 45 regions of the openings 35, only the upper bank segment 43 is formed.

Even though the first lower bank segment 41, formed in the arc 44 regions of the openings 35, has a lower wettability than a silicon nitride film, it can be wetted with ink so that the arc 44 regions, which are not relatively readily filled with ink, can be filled with ink.

As described in detail above, the second embodiment provides the following advantage in addition to the advantage (1) of the first embodiment.

(4) According to the second embodiment, only the upper bank segment 43 is formed in the straight 45 regions of the openings 35, and no lower bank segment 46 is formed therein. The aperture ratio of these regions (regions in the X direction) can therefore be increased. In addition, the straight 45 regions of the openings 35 are widened, so that ejected ink can be spread over a wider area and is therefore less likely to spill. Furthermore, as described above, the arc 44 regions can be filled with ink.

Third Embodiment

FIGS. 6A to 6C are schematic diagrams showing the structure of a bank in an organic EL device according to the third embodiment. FIG. 6A is a schematic plan view of the bank as viewed from above. FIG. 6B is a schematic sectional view, taken along line VIB-VIB of FIG. 6A, of the bank. FIG. 5C is a schematic sectional view, taken along line VIC-VIC of FIG. 6A, of the bank. The structure of the bank will now be described with reference to FIGS. 6A to 6C. The bank structure of the third embodiment differs from that of the first embodiment in that only the second lower bank segment is formed under the upper bank segment in the straight-side regions. The same components as used in the first embodiment are denoted by the same reference numerals, and a description thereof will be omitted or condensed.

Referring to FIGS. 6A to 6C, in the arc 44 regions of the openings 35, the first lower bank segment 41, the second lower bank segment 42, and the upper bank segment 43 are stacked in the form of steps in the above order from the glass substrate 13 side.

In the straight line 45 regions of the openings 35, the second lower bank segment 42 and the upper bank segment 43 are stacked in the form of steps in the above order from the glass substrate 13 side. To ensure insulation between the pixel electrodes 32, the second lower bank segment 42 is formed so as to cover the peripheries of the pixel electrodes 32.

Because the second lower bank segment 42 is provided on the first lower bank segment 41 in the arc 44 regions of the openings 35, the second lower bank segment 42 can be wetted with ink so that the arc 44 regions, which are not relatively readily filled with ink, can be filled with ink.

As described in detail above, the third embodiment provides the following advantage in addition to the advantage (1) of the first embodiment.

(5) According to the third embodiment, the second lower bank segment 42 is provided in the straight 45 regions of the openings 35. The second lower bank segment 42, formed of a silicon nitride film, can be wetted with ink. This increases ink flatness in the light-emitting regions 12, thus enabling uniform light emission. In addition, the silicon nitride film is formed so as to cover the peripheries of the pixel electrodes 32, thus ensuring insulation between the pixel electrodes 32.

Fourth Embodiment

Figure 7B:
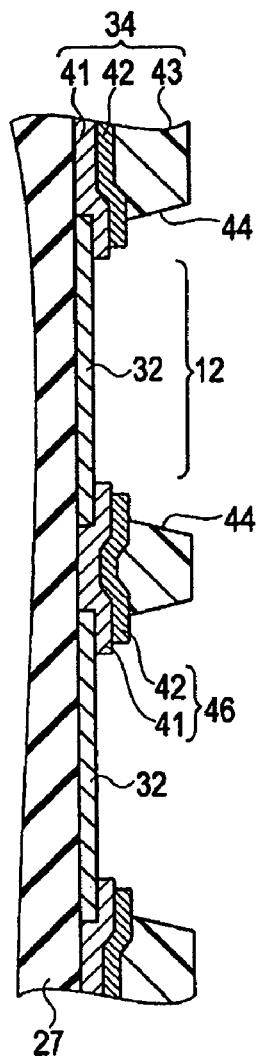
FIGS. 7A to 7C are schematic diagrams showing the structure of a bank in an organic EL device according to a fourth embodiment.
Figure 7A:
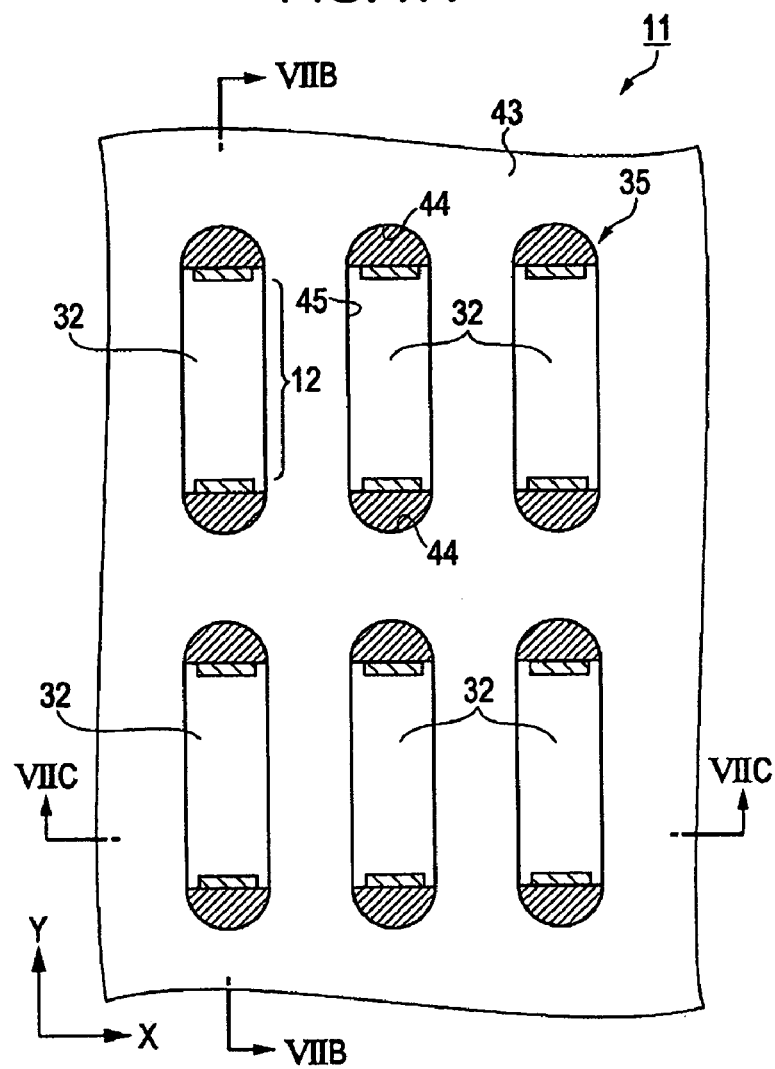
Figure 7C:
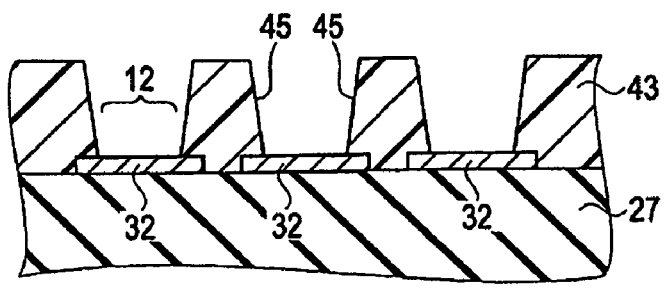

FIGS. 7A to 7C are schematic diagrams showing the structure of a bank in an organic EL device according to the fourth embodiment. FIG. 7A is a schematic plan view of the bank as viewed from above. FIG. 7B is a schematic sectional view, taken along line VIIB-VIIB of FIG. 7A, of the bank. FIG. 7C is a schematic sectional view, taken along line VIIC-VIIC of FIG. 7A, of the bank. The structure of the bank will now be described with reference to FIGS. 7A to 7C. The bank structure of the fourth embodiment differs from that of the first embodiment in that no lower bank segment is formed under the upper bank segment in the straight-side regions. The same components as used in the first embodiment are denoted by the same reference numerals, and a description thereof will be omitted or condensed.

Referring to FIGS. 7A to 7C, in the arc 44 regions of the openings 35, the first lower bank segment 41, the second lower bank segment 42, and the upper bank segment 43 are stacked in the form of steps in the above order from the glass substrate 13 side. In the straight line 45 regions of the openings 35, only the upper bank segment 43 is formed.

Because the second lower bank segment 42 is provided on the first lower bank segment 41 in the arc 44 regions of the openings 35, the second lower bank segment 42 can be wetted with ink so that the arc 44 regions, which are not relatively readily filled with ink, can be filled with ink.

As described in detail above, the fourth embodiment provides the following advantage in addition to the advantage (1) of the first embodiment.

(6) According to the fourth embodiment, only the upper bank segment 43 is formed in the straight 45 regions of the openings 35, and no lower bank segment 46 is formed therein. The aperture ratio of these regions (regions in the X direction) can therefore be increased. In addition, the straight 45 regions of the openings 35 are widened, so that ejected ink can be spread over a wider area and is therefore less likely to spill.

Fifth Embodiment

FIGS. 8A to 8C are schematic diagrams showing the structure of a bank in an organic EL device according to the fifth embodiment after a step of forming the bank. FIG. 8A is a schematic plan view of the organic EL device as viewed from above. FIG. 8B is a schematic sectional view, taken along line VIIIB-VIIIB of FIG. 8A, of the organic EL device. FIG. 8C is a schematic sectional view, taken along line VIIIC-VIIIC of FIG. 8A, of the organic EL device. The structure of the organic EL device will now be described with reference to FIGS. 1 and 8A to 8C.

In an organic EL device 91, a bank 34 has openings 35 that are, for example, track-shaped in plan view (see FIG. 8A). Specifically, the openings 35 of the bank 34 have light-emitting regions 12 with long and short sides and arc 44 regions on the short sides of the light-emitting regions 12.

The bank 34 includes a first bank segment 141 disposed on the glass substrate 13 side and a second bank segment 142 stacked on the side of the first bank segment 141 facing away from the glass substrate 13. The first bank segment 141 is formed of, for example, an inorganic material such as $SiO_2$, $TiO_2$, or SiN. The second bank segment 142 is formed of, for example, a material containing polysiloxane and titanium oxide. Although the bank 34 is formed of the multilayer structure of the first bank segment 141 and the second bank segment 142 in this embodiment, it may instead be formed only of the second bank segment 142.

To ensure insulation between the adjacent pixel electrodes 32, the first bank segment 141 is formed so as to cover the peripheries of the pixel electrodes 32. That is, the first bank segment 141 overlaps the pixel electrodes 32 in plan view (not shown in FIG. 8A). In other words, the first bank segment 141 is formed in the region other than the light-emitting regions 12. The edges of the first bank segment 141 are closer to the centers of the pixel electrodes 32 than the edges of the second bank segment 142.

Although the first bank segment 141 is formed so as to cover the peripheries of the pixel electrodes 32 in this embodiment, it may instead be formed so that the side surfaces of the first bank segment 141 are flash with those of the second bank segment 142. In this case, the light-emitting regions 12 can be widened as compared with the case where the first bank segment 141 is formed so as to cover the peripheries of the pixel electrodes 32.

The second bank segment 142 has, for example, a trapezoidal shape with inclined surfaces in cross section. The second bank segment 142 includes first portions 142a and second portions 142b. The first portions 142a have a lower liquid repellency than the second portions 142b. The first portions 142a, having a lower liquid repellency (i.e., a higher wettability), include arc 44 portions around the openings 35 of the second bank segment 142. The second portions 142b, having a higher liquid repellency (i.e., a lower wettability), include straight line 45 portions around the openings 35 of the second bank segment 142. The first portions 142a have the inclined surfaces at the arc 44 portions (see FIG. 8B). The second portions 142b have the inclined surfaces at the straight line 45 portions.

The term "lower liquid repellency" refers to a relatively small contact angle with liquid. Hence, the arc 44 regions (see FIG. 8A), which have a lower liquid repellency, can more readily be filled with ink. Conversely, the term "higher liquid repellency" refers to a relatively large contact angle with liquid. Hence, liquid is less likely to spill out of the straight line 45 regions (see FIG. 8A), which have a higher liquid repellency. A detailed description of the material of the second bank segment 142 and a method for producing the second bank segment 142 will be given later.

The functional layers 33, including the hole-injecting layers 51 and the light-emitting layers 52, for example, are provided in regions surrounded by the bank 34, that is, the openings 35 (light-emitting regions 12). The hole-injecting layers 51 are disposed in recesses whose bottoms are defined by the pixel electrodes 32 and whose sidewalls are defined by the first bank segment 141 and the second bank segment 142 (see FIG. 8B).

The hole-injecting layers 51 are formed of a conductive polymer layer formed of a conductive polymer material containing a dopant. The hole-injecting layers 51 can be formed of, for example, PEDOT-PSS.

The light-emitting layers 52 are provided on the hole-injecting layers 51. With the first portions 142a of the second bank segment 142, the openings 35 can readily be wetted (filled) inside the arcs 44 with a functional liquid ejected to form the light-emitting layers 52. With the second portions 142b of the second bank segment 142, the functional liquid is less likely to spill out of the straight line 45 regions of the openings 35. The light-emitting layers 52 can therefore be easily formed in the openings 35 with uniform thickness.

The cathode 16 is provided on the light-emitting layers 52 and the second bank segment 142. In other words, the cathode 16 is provided on the side of the light-emitting layers 52 facing away from the pixel electrodes 32. The cathode 16 is, for example, a laminate of calcium (Ca) and aluminum (Al) films. A sealing member (not shown) formed of, for example, resin is stacked on the cathode 16 to prevent intrusion of moisture and oxygen. The light-emitting element layer 15 and the cathode 16 constitute display elements 53.

Figure 9:
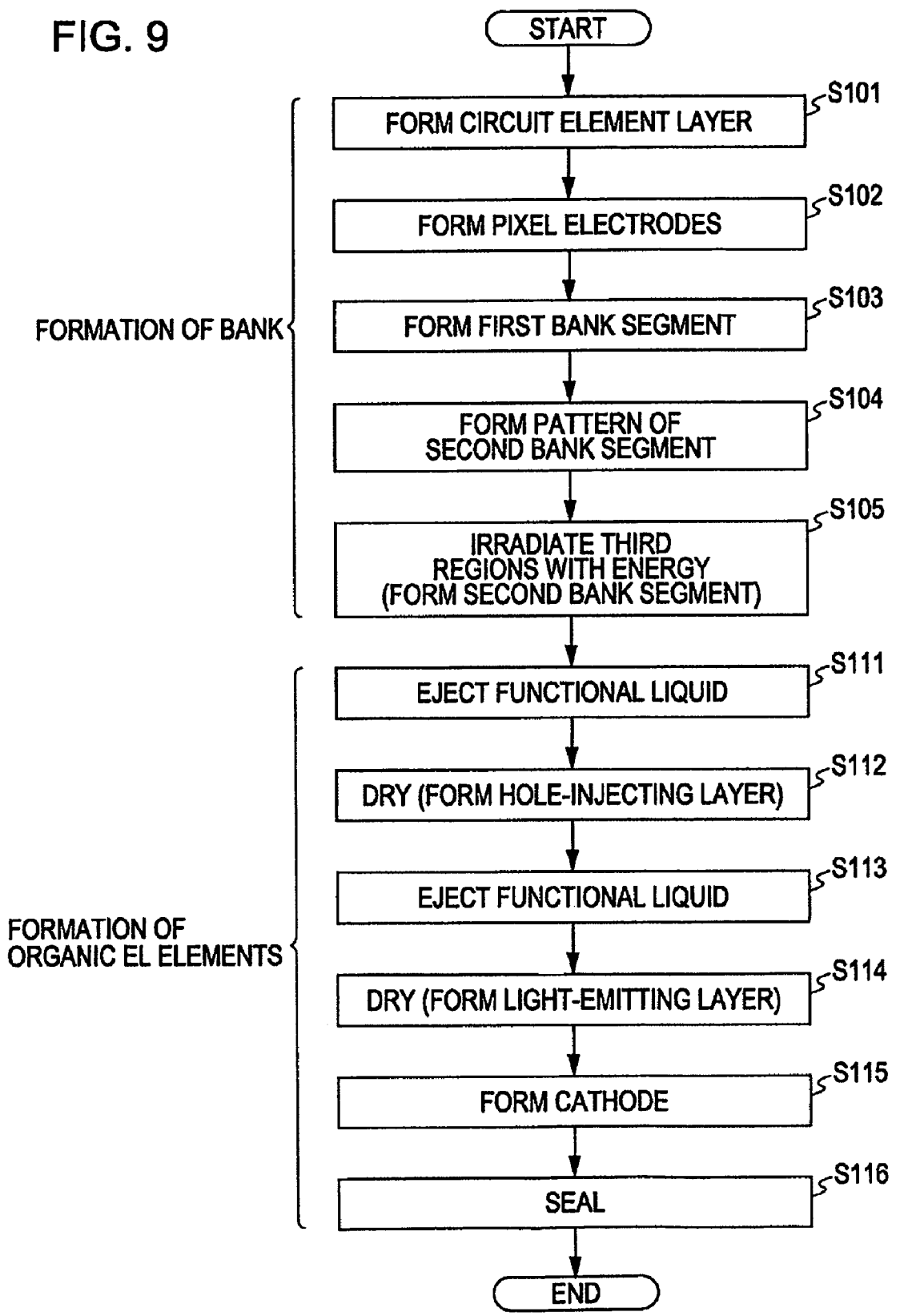
FIG. 9 is a flowchart of a method for producing the organic EL device.

FIG. 9 is a flowchart of a method for producing the organic EL device 91. The method for producing the organic EL device 91 will now be described with reference to FIG. 9.

Referring to FIG. 9, the method for producing the organic EL device 91 includes Steps S101 to S105, through which a bank is formed, and Steps S111 to S116, through which organic EL elements are formed. In Step S101, first, the circuit element layer 14 is formed on the glass substrate 13 by a known film-deposition technique. In Step S102 (formation of pixel electrodes), the pixel electrodes 32 are formed on the circuit element layer 14 using ITO.

In Step S103, the first bank segment 141 is formed on the circuit element layer 14 and the pixel electrodes 32. Specifically, a layer (first bank segment layer) containing silicon oxide ($SiO_2$), for example, is formed over the circuit element layer 14 and the pixel electrodes 32 as the material of the first bank segment 141 by a method such as CVD. The first bank segment layer is then patterned by photolithography and etching to form the first bank segment 141, with openings 141a formed in regions corresponding to the light-emitting regions 12. If the first bank segment 141 is to be formed so that the side surfaces of the first bank segment 141 are flush with those of the second bank segment 142, the openings 141a are not formed in Step S103; instead, they may be formed together with openings 142c in Step S104.

A coating liquid used as the material of the second bank segment 142 will now be described. The coating liquid contains titanium oxide and polysiloxane. Titanium oxide serves as a photocatalyst to change the wettability of the surfaces of the first portions 142a of the second bank segment 142 when third regions, corresponding to the first portions 142a, are irradiated with energy. The wettability may be changed not only on the surfaces, but also in the entire first portions 142a.

Polysiloxane has a liquid-repellent substituent directly bonded to its silicon atoms. Examples of the liquid-repellent substituent include alkyl, fluoroalkyl, vinyl, amino, phenyl, and epoxy groups. In this embodiment, a fluoroalkyl group is used. This structure of polysiloxane imparts liquid repellency to the second portions 142b of the second bank segment 142 formed using the coating liquid. A layer formed of the coating liquid gains lyophilicity (low liquid repellency) when irradiated with energy because the substituent is decomposed, for example, by photocatalysis. That is, the first portions 142a of the second bank segment 142 are selectively irradiated with energy to gain increased lyophilicity, whereas the rest of the second bank segment 142, namely, the second portions 142b, remains liquid-repellent.

In Step S104 (coating, formation of a bank layer, and formation of openings), a pattern of the second bank segment 142 is formed on the first bank segment 141 by patterning. First, the coating liquid used as the material of the second bank segment 142 is applied to the first bank segment 141 and the light-emitting regions 12. Next, the coating liquid is dried to form a second bank segment layer as a bank layer. The openings 142c are then formed in the regions of the second bank segment layer corresponding to the light-emitting regions 12, thus forming the pattern of the second bank segment 142.

In Step S105 (energy irradiation), the second bank segment 142 is finished by forming the first portions 142a of the second bank segment 142 so that they have a lower liquid repellency (higher wettability). First, a mask having openings in regions corresponding to the first portions 142a is placed, and only the first portions 142a (third regions) are irradiated with energy through the mask. The energy irradiation is performed, for example, using an ultrahigh-pressure mercury lamp (30 mW/$cm^2$; wavelength: 365 nm) for an exposure time of 30 seconds. The energy irradiation activates titanium oxide to decrease the contact angle of the first portions 142a with liquid, so that the first portions 142a can have a lower liquid repellency (higher wettability) than the second portions 142b. Thus, the second bank segment 142 can be formed so that the first portions 142a have a smaller contact angle and the second portions 142b have a larger contact angle.

The formation of the bank is thus finished, with the first portions 142a of the second bank segment 142 having a contact angle with liquid (functional liquid) of 30° (first contact angle) and the second portions 142b having a contact angle with liquid (functional liquid) of 80° (second contact angle).

In Step S111, subsequently, a functional liquid containing the material of the hole-injecting layers 51 is ejected into the light-emitting regions 12, surrounded by the first bank segment 141 and the second bank segment 142, on the pixel electrodes 32 by droplet ejection (for example, ink jetting). Specifically, droplets of the functional liquid are ejected into the recesses whose bottoms are defined by the pixel electrodes 32 and whose sidewalls are defined by the first bank segment 141 and the second bank segment 142. The functional liquid for the hole-injecting layers 51 may be, for example, a PEDOT-PSS dispersion. An example of the PEDOT-PSS dispersion used is one containing PEDOT and PSS in a weight ratio of 1:10, having a solid content of 0.5%, and containing 50% diethylene glycol, with the balance being pure water.

In Step S112, the functional liquid is dried to form the hole-injecting layers 51. Specifically, the functional liquid is dried or fired in a high-temperature environment to evaporate the solvent and thereby solidify the PEDOT-PSS contained in the functional liquid, thus forming the hole-injecting layers 51 in the openings 35. The functional liquid may be dried by, for example, keeping the glass substrate 13 in an environment at 200° C. for ten minutes.

In Step S113 (formation of light-emitting layers), functional liquids containing the materials of the light-emitting layers 52 are ejected onto the hole-injecting layers 51 by droplet ejection. An example of the functional liquids for the light-emitting layers 52 is one containing a red fluorescent material in a solid content of 0.8% and cyclohexylbenzene as a solvent.

As described above, because the arc 44 portions around the openings 35 of the second bank segment 142 are the first portions 142a, which have a lower liquid repellency, the functional liquid (for example, the functional liquids for the light-emitting layers 52) deposited on the first portions 142a can be prevented from receding. In addition, because the straight line 45 portions around the openings 35 of the second bank segment 142 are the second portions 142b, which have a higher liquid repellency, the functional liquid can be prevented from spilling out of the openings 35. Thus, the light-emitting layers 52 can have a uniform thickness in the openings 35.

In Step S14 (formation of light-emitting layers), the functional liquids are dried to form the light-emitting layers 52. Specifically, the functional liquids are dried or fired in a high-temperature environment to evaporate the solvent and thereby solidify the materials contained in the functional liquids, thus forming the light-emitting layers 52. The functional liquids may be dried by, for example, keeping the glass substrate 13 in an environment at 100° C. for one hour. The light-emitting layers 52 thus formed have a thickness of, for example, 100 nm. The light-emitting layers 52 have a larger area than the hole-injecting layers 51 so that relatively flat regions of the light-emitting layers 52 can be used for light emission.

In Step S115 (formation of a cathode), a calcium film and an aluminum film are formed in the above order over substantially the entire surface of the glass substrate 13, on which the light-emitting layers 52 have been formed, by a method such as vapor deposition, thus forming the cathode 16. The calcium film thus formed has a thickness of, for example, 5 nm. The aluminum film thus formed has a thickness of, for example, 300 nm.

In Step S116, the top of the cathode 16 is sealed with an adhesive and a glass substrate to form organic EL elements, thus finishing the organic EL device 91.

As described in detail above, the fifth embodiment provides the following advantages.

(7) According to the fifth embodiment, the arc 44 portions around the openings 35 of the second bank segment 142 are the first portions 142a, which have a lower liquid repellency. The arc 44 portions can therefore be wetted with, for example, a functional liquid (for example, the functional liquids for the light-emitting layers 52), so that the regions inside the arcs 44, which are not relatively readily filled with a functional liquid, can be filled with a functional liquid. In addition, the straight line 45 portions around the openings 35 are the second portions 142b, which have a higher liquid repellency, thus preventing a functional liquid from spilling out of the openings 35. As a result, the light-emitting layers 52 can be formed in the light-emitting regions 12 with uniform thickness, thus enabling uniform light emission.

(8) According to the fifth embodiment, a photocatalyst is used to change the wettability of the surfaces of the first portions 142a so that they have a lower liquid repellency. The same material can therefore be used to form two types of banks without the step of patterning layers of different materials to form the first portions 142a and the second portions 142b.

Sixth Embodiment

Figure 10:
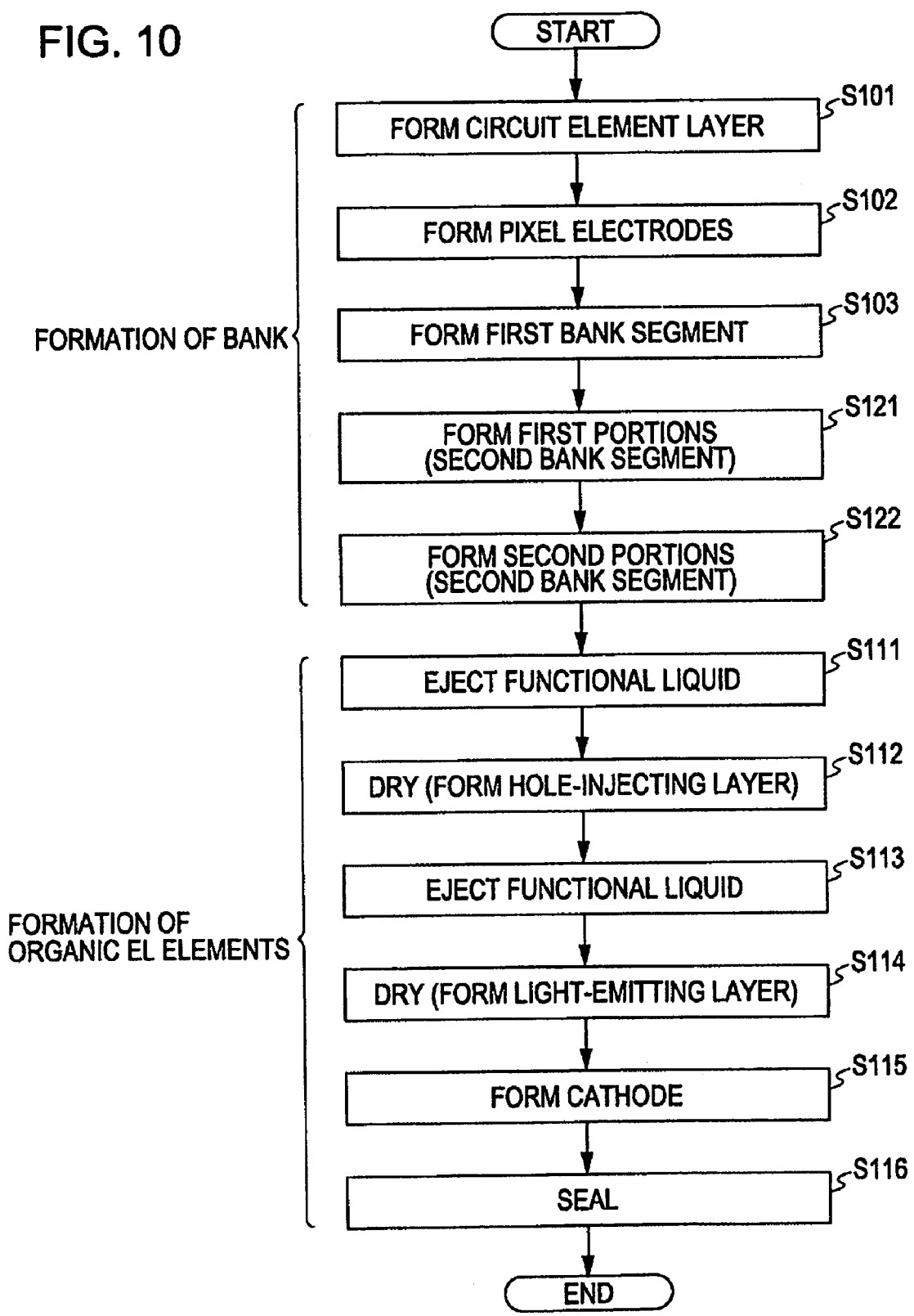
FIG. 10 is a flowchart of a method for producing an organic EL device according to a sixth embodiment.

FIG. 10 is a flowchart of a method for producing an organic EL device according to the sixth embodiment. The method for producing the organic EL device will now be described with reference to FIG. 10. The organic EL device according to the sixth embodiment differs from that according to the fifth embodiment in that the first portions 142a of the second bank segment 142 are formed of an acrylic resin (first material) and the second portions 142b are formed of an acrylic resin containing a fluorine-containing material (second material). The same components as used in the fifth embodiment are denoted by the same reference numerals, and a description thereof will be omitted or condensed.

First, the structure of an organic EL device 91 according to the sixth embodiment will be described. In the organic EL device 91, for example, third regions including the arcs 44 around the openings 35 of the second bank segment 142 are first portions 142a formed of, for example, an acrylic resin, and fourth regions including the straight lines 45 around the openings 35 of the second bank segment 142 are second portions 142b formed of, for example, an acrylic resin containing a fluorine-containing material.

Fluorine, contained in the acrylic resin, will now be described. Because fluorine has an extremely low surface energy, the surface of a material containing a larger amount of fluorine has a lower critical surface tension. Accordingly, the surface of a material having a lower fluorine content has a higher critical surface tension than the surface of a material having a higher fluorine content. This means that the surface of a material having a lower fluorine content is more lyophilic than the surface of a material having a higher fluorine content. The method for producing the organic EL device 91 will now be described, where Steps S101 to S103 are the same as those of the fifth embodiment.

In Step S121, the first portions 142a of the second bank segment 142 are formed on the first bank segment 141. An example of the material of the first portions 142a, having a lower liquid repellency, is an acrylic resin, as described above. First, an acrylic resin is deposited on the glass substrate 13, including the first bank segment 141. The acrylic resin is then patterned into the pattern of the first portions 142a by photolithography and etching.

In Step S122, the second portions 142b are formed adjacent to the first portions 142a on the first bank segment 141. An example of the material of the second portions 142b, having a higher liquid repellency, is an acrylic resin containing a fluorine-containing material, as described above. First, an acrylic resin containing a fluorine-containing material is deposited on the glass substrate 13, including the first bank segment 141 and the first portions 142a of the second bank segment 142. The acrylic resin is then patterned into the pattern of the second portions 142b by photolithography and etching. Preferably, the second portions 142b, having a higher liquid repellency (larger contact angle), are thicker than the first portions 142a, having a lower liquid repellency (smaller contact angle). In this case, although liquid tends to spill out of the straight line 45 regions of the openings 35 of the bank 34, the second portions 142b can prevent the liquid from spilling out of the straight line 45 regions.

The second bank segment 142 is thus finished, with the first portions 142a formed of an acrylic resin and the second portions 142b formed of an acrylic resin containing a fluorine-containing material. The first portions 142a have a contact angle with a functional liquid of 30°, and the second portions 142b have a contact angle with a functional liquid of 80°. Subsequently, Steps S111 to S116 are carried out as in the fifth embodiment, thus finishing the organic EL device 91.

As described in detail above, the sixth embodiment provides the following advantage in addition to the advantage (7) of the fifth embodiment.

(9) According to the sixth embodiment, the first portions 142a, including the arc 44 portions, are formed of an acrylic resin, and the second portions 142b, including the straight line 45 portions, are formed of an acrylic resin containing a fluorine-containing material, so that the first portions 142a can have a lower liquid repellency and the second portions 142b can have a higher liquid repellency. Despite the increased number of production steps, the two types of liquid-repellent portions can be formed without energy irradiation as employed in the fifth embodiment.

Seventh Embodiment

Figure 11:
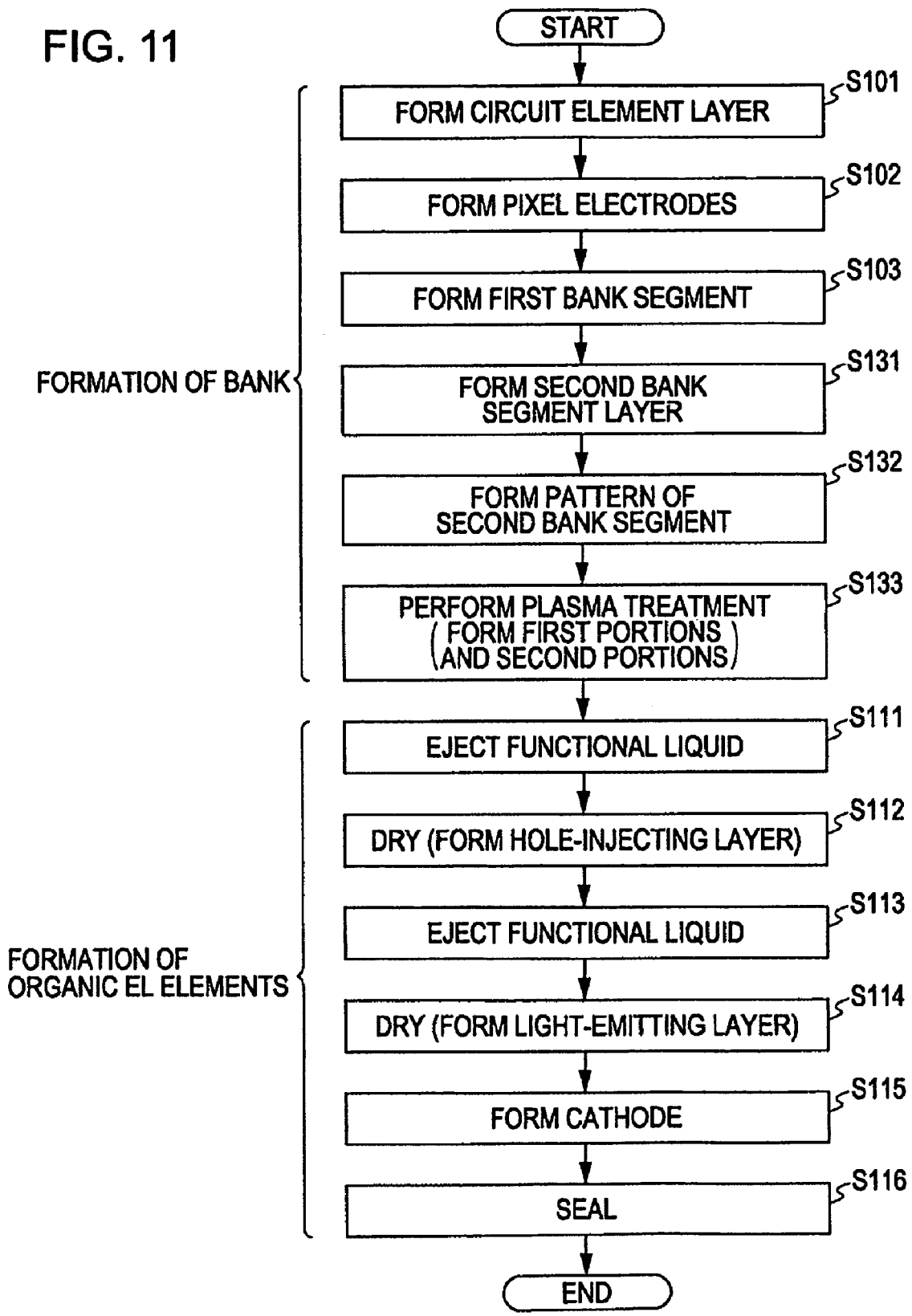
FIG. 11 is a flowchart of a method for producing an organic EL device according to a seventh embodiment.

FIG. 11 is a flowchart of a method for producing an organic EL device according to the seventh embodiment. The method for producing the organic EL device will now be described with reference to FIG. 11. The organic EL device according to the seventh embodiment differs from that according to the fifth embodiment in that the fourth regions, corresponding to the second portions 142b, are subjected to plasma treatment for a longer period of time (larger number of times) than the third regions, corresponding to the first portions 142a, to form the first portions 142a, having a lower liquid repellency, and the second portions 142b, having a higher liquid repellency. The same components as used in the fifth embodiment are denoted by the same reference numerals, and a description thereof will be omitted or condensed. Steps S101 to S103 are the same as those of the fifth embodiment.

In Step S131, a second bank segment layer, for example, an acrylic resin layer, to form the second bank segment 142 is formed on the glass substrate 13, including the first bank segment 141. The second bank segment layer is formed by, for example, vapor deposition.

In Step S132, the second bank segment layer is patterned into the pattern of the second bank segment 142. Specifically, the patterning is performed by photolithography and etching.

In Step S133, the first portions 142a, having a lower liquid repellency, and the second portions 142b, having a higher liquid repellency, are formed in the second bank segment 142. The third regions, corresponding to the first portions 142a of the second bank segment 142, are subjected to, for example, oxygen plasma treatment using oxygen ($O_2$) gas. The fourth regions, corresponding to the second portions 142b, are subjected to, for example, carbon tetrafluoride ($CF_4$) plasma treatment using tetrafluoromethane. The plasma treatment time for the fourth regions is, for example, ten times that for the third regions.

Specifically, the third regions may be subjected to, for example, oxygen plasma treatment at a plasma power of 100 to 800 kW, an oxygen gas flow rate of 50 to 100 ml/min, a substrate transportation speed of 0.5 to 10 mm/sec, and a substrate temperature of 70° C. to 90° C., so that the first portions 142a become lyophilic (less liquid-repellent).

The fourth regions, on the other hand, may be subjected to, for example, carbon tetrafluoride plasma treatment at a plasma power of 100 to 800 kW, a tetrafluoromethane gas flow rate of 50 to 100 ml/min, a substrate transportation speed of 0.5 to 10 mm/sec, and a substrate temperature of 70° C. to 90° C., so that the second portions 142b become liquid-repellent (more liquid-repellent). The carbon tetrafluoride plasma treatment for the fourth regions may be performed, for example, ten times.

The second bank segment 142 is thus finished, with the first portions 142a having a lower liquid repellency and the second portions 142b having a higher liquid repellency. The first portions 142a have a surface roughness Ra of 0.9 nm and a contact angle with a functional liquid of 50°, and the second portions 142b have a surface roughness Ra of 15 nm and a contact angle with a functional liquid of 80°. After Step S133, Steps S111 to S116 are carried out as in the fifth embodiment, thus finishing the organic EL device 91.

As described in detail above, the seventh embodiment provides the following advantage in addition to the advantage (7) of the fifth embodiment.

(10) According to the seventh embodiment, the first portions 142a, having a lower liquid repellency, and the second portions 142b, having a higher liquid repellency, are formed by subjecting the third and fourth regions to the respective plasma treatments for different plasma irradiation times. This can be performed in a general treatment step, so that the first portions 142a and the second portions 142b can relatively readily be formed.

The invention is not limited to the above embodiments; for example, the following modifications are permitted.

First Modification

Figure 12B:
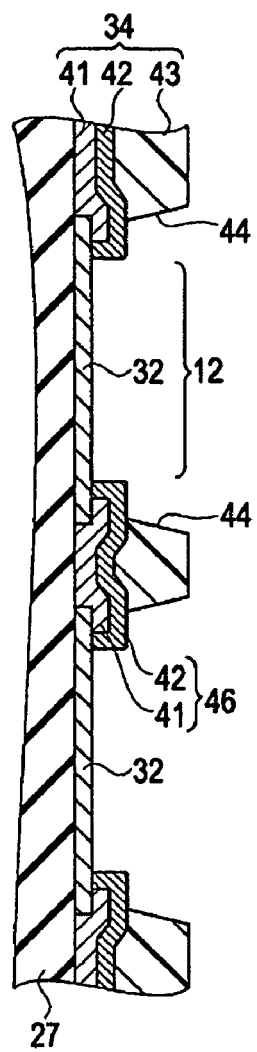
FIGS. 12A to 12C are schematic diagrams of a modification of the structure of a bank.
Figure 12A:
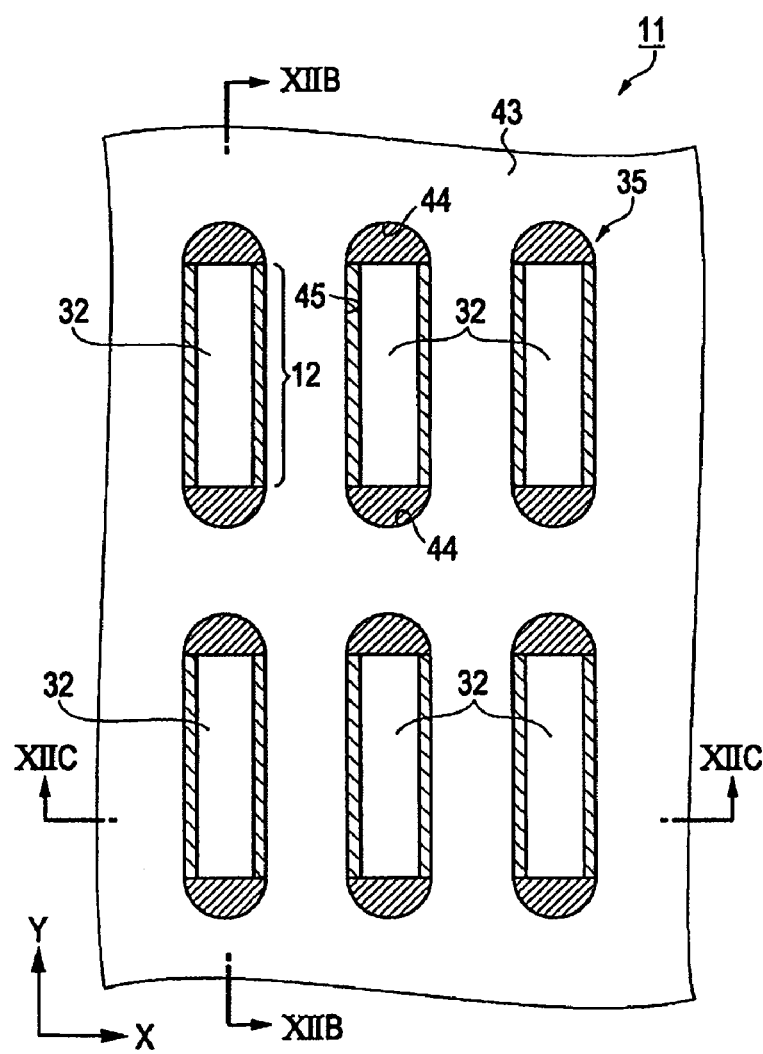
Figure 12C:
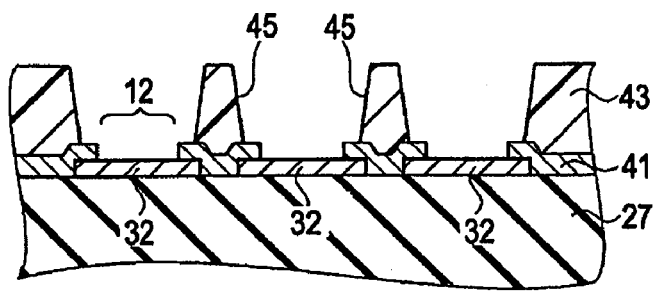

The structure of the bank 34 is not limited to those of the first to fourth embodiments; for example, bank structures shown in FIGS. 12A to 12C and 13A to 13C may be employed. FIG. 12A is a schematic plan view of a bank as viewed from above. FIG. 12B is a schematic sectional view, taken along line XIIB-XIIB of FIG. 12A, of the bank. FIG. 12C is a schematic sectional view, taken along line XIIC-XIIC of FIG. 12A, of the bank. The structure of the bank 34 shown in FIGS. 12A to 12C differs from that of the first embodiment in that the second lower bank segment 42 is formed so as to cover the first lower bank segment 41 in the arc 44 regions. In the arc 44 regions of the openings 35, the first lower bank segment 41, the second lower bank segment 42, and the upper bank segment 43 are stacked in the form of steps in the above order from the glass substrate 13 side. Of the lower bank segments 46, only the second lower bank segment 42 is exposed because the second lower bank segment 42 is formed so as to cover the first lower bank segment 41. The first lower bank segment 41 is formed so as to cover the peripheries of the pixel electrodes 32. In the straight line 45 regions, the first lower bank segment 41 and the upper bank segment 43 are provided in the above order from the glass substrate 13 side.

In this structure of the bank 34, only the second lower bank segment 42, formed of a silicon nitride film, is exposed in the arc 44 regions. The second lower bank segment 42 can be wetted with ink more readily than the first lower bank segment 41, formed of a silicon oxide film, so that the arc 44 regions, which are not relatively readily filled with ink, can be filled with ink. In addition, the first lower bank segment 41 is formed so as to cover the peripheries of the pixel electrodes 32, thus ensuring insulation between the pixel electrodes 32. Furthermore, the first lower bank segment 41, formed of a silicon oxide film, is provided in the straight line 45 regions. In this case, ink can be efficiently used because the amount of unnecessary ink deposited on the second lower bank segment 42, formed of a film with a higher wettability, namely, a silicon nitride film, can be reduced as compared with the case where the second lower bank segment 42 is formed in the straight line 45 regions.

Figure 13B:
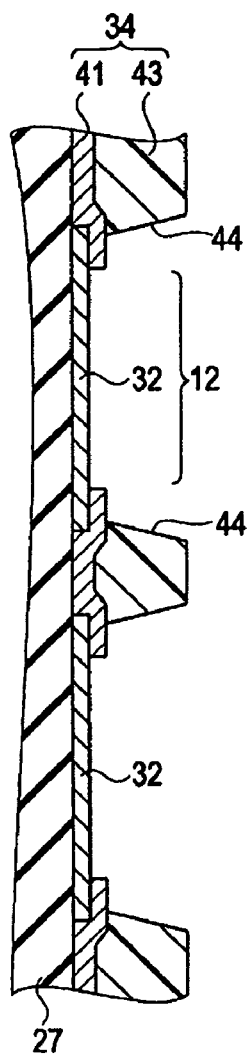
FIGS. 13A to 13C are schematic diagrams of another modification of the structure of a bank.
Figure 13A:
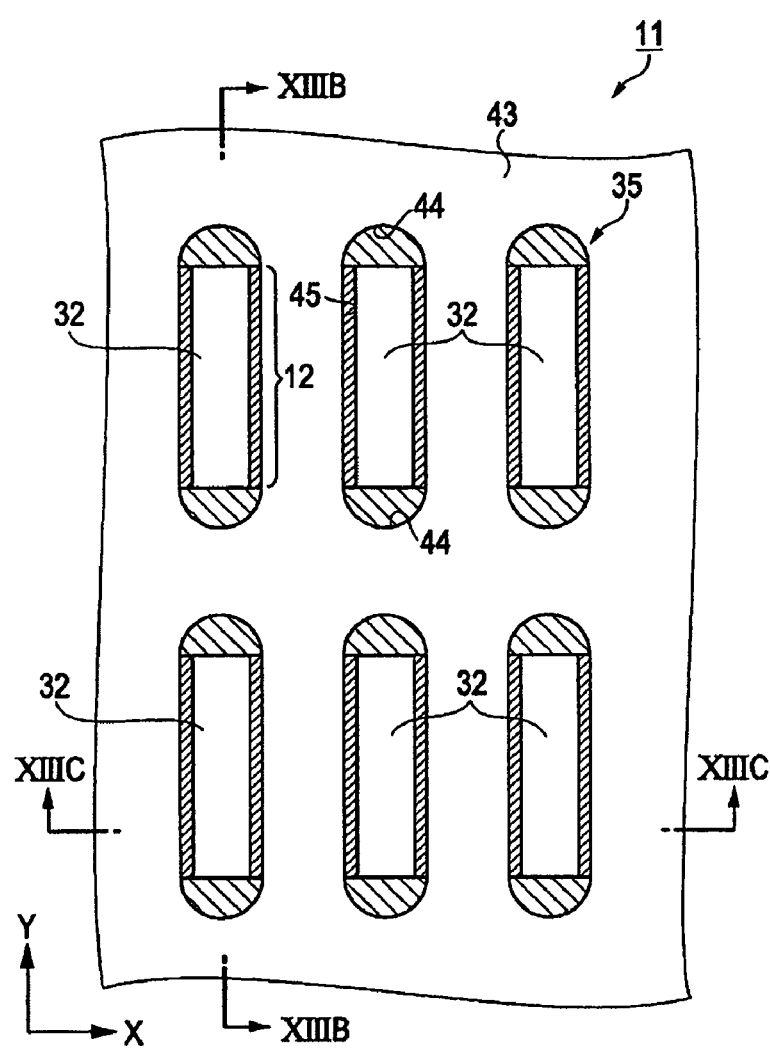
Figure 13C:
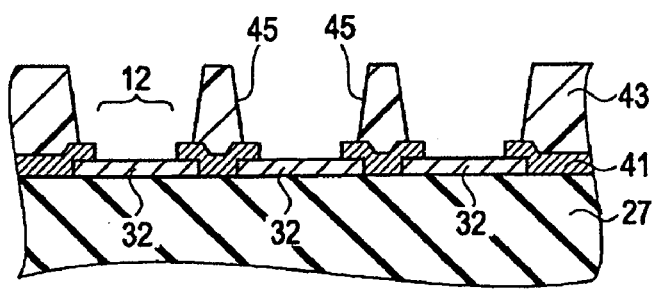

FIG. 13A is a schematic plan view of a bank as viewed from above. FIG. 13B is a schematic sectional view, taken along line XIIIB-XIIIB of FIG. 13A, of the bank. FIG. 13C is a schematic sectional view, taken along line XIIIC-XIIIC of FIG. 13A, of the bank. The structure of the bank 34 shown in FIGS. 13A to 13C differs from that of the first embodiment in that only the first lower bank segment 41 is formed under the upper bank segment 43 in the arc 44 regions and only the second lower bank segment 42 is formed under the upper bank segment 43 in the straight line 45 regions. In the arc 44 regions of the openings 35, the first lower bank segment 41 and the upper bank segment 43 are stacked in the form of steps in the above order from the glass substrate 13 side. The first lower bank segment 41 is formed so as to cover the peripheries of the pixel electrodes 32. In the straight line 45 regions of the openings 35, the second lower bank segment 42 and the upper bank segment 43 are stacked in the form of steps in the above order from the glass substrate 13 side. The second lower bank segment 42 is formed so as to cover the peripheries of the pixel electrodes 32.

In this structure of the bank 34, the arc 44 regions can be filled with ink because the first lower bank segment 41 is provided in the arc 44 regions. In addition, ink can be used efficiently because the amount of unnecessary ink deposited on the second lower bank segment 42, formed of a film with a higher wettability, namely, a silicon nitride film, can be reduced as compared with the case where the second lower bank segment 42 is formed in the arc 44 regions. Furthermore, the second lower bank segment 42 is provided in the straight 45 regions of the openings 35. The second lower bank segment 42, formed of a silicon nitride film, can be wetted with ink. This increases ink flatness in the light-emitting regions 12, thus enabling uniform light emission.

Second Modification

Figure 14A:
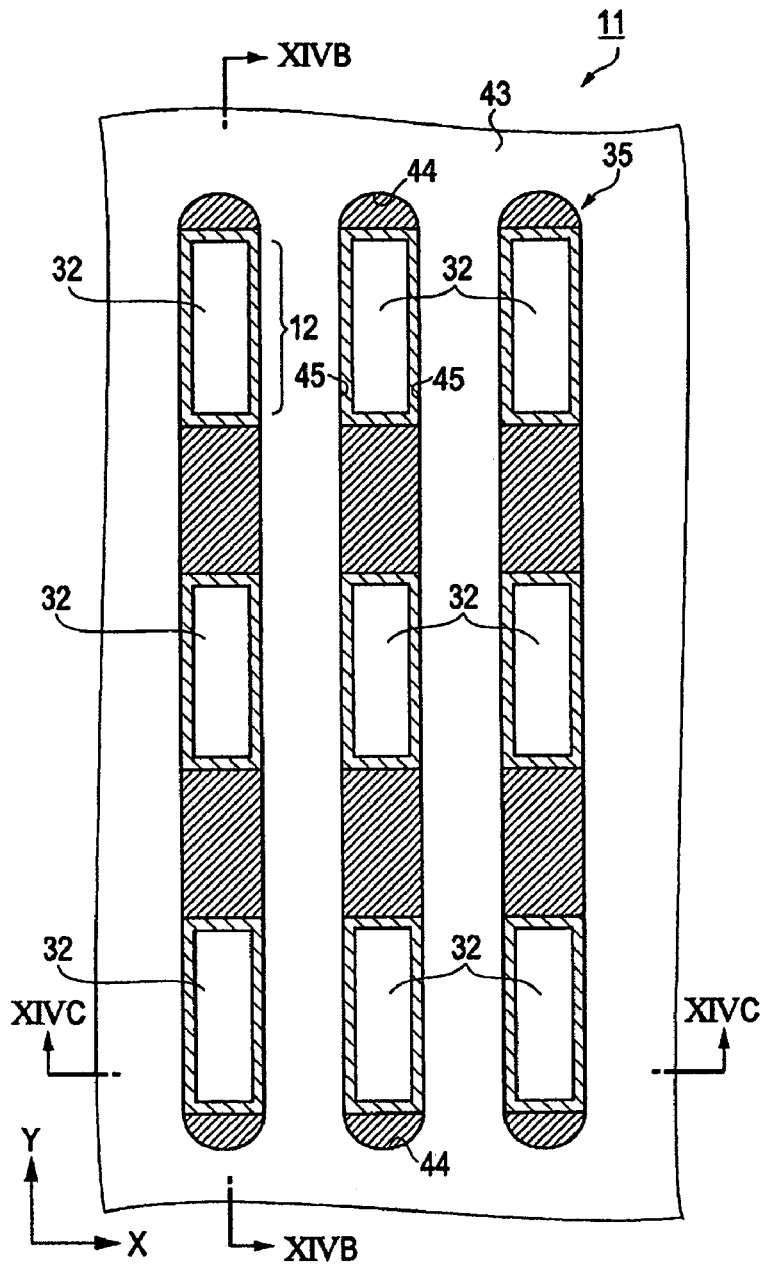
FIGS. 14A to 14C are schematic diagrams of another modification of the structure of a bank.
Figure 14B:
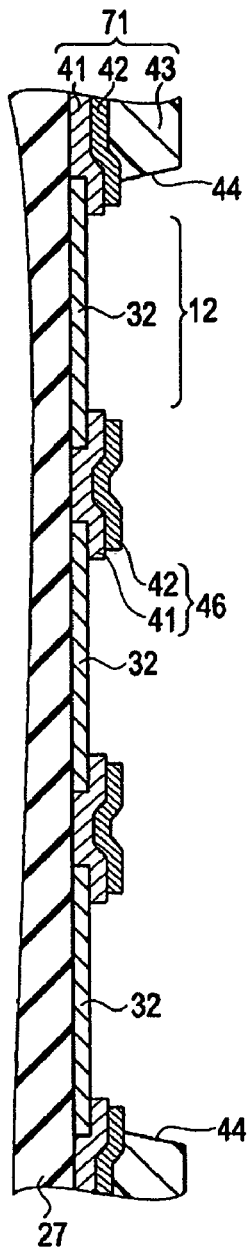
Figure 14C:
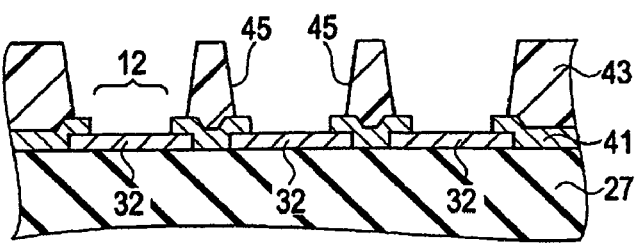

The shape of the openings 35 of the bank 34 (shape as viewed in a direction normal to the glass substrate 13) is not limited to a track shape in plan view; for example, the shapes shown in FIGS. 14A to 14C to 17 may be employed. A bank 71 shown in FIGS. 14A to 14C is a common bank (hereinafter referred to as the "common bank 71") that partitions pixel regions, each including a plurality of light-emitting elements. In the arc 44 regions of the openings 35, the first lower bank segment 41, the second lower bank segment 42, and the upper bank segment 43 are stacked in the form of steps in the above order from the glass substrate 13 side. The first lower bank segment 41 and the second lower bank segment 42 are also provided between the pixel electrodes 32 in the openings 35. In the straight line 45 regions, the first lower bank segment 41 and the upper bank segment 43 are stacked in the above order from the glass substrate 13 side. That is, the lower bank segments 46 of this modification have the same structure as those of the first embodiment except that the openings 35 have a different shape. The structure of the lower bank segments 46 is not limited to the above structure of the bank 71, and the structures of the lower bank segments 46 shown in the second to fourth embodiments and the first modification may be applied to the common bank 71. With the common bank 71, the arc 44 regions, which are not readily filled with a functional liquid, can be filled with a functional liquid, and the aperture ratio in the X direction can be increased.

Figure 15:
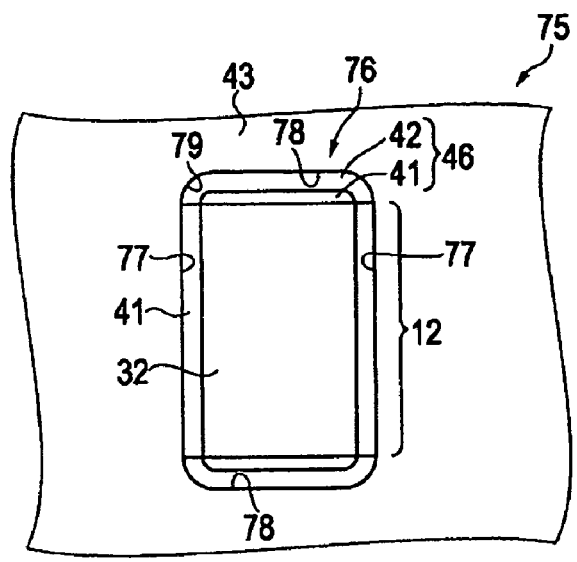
FIG. 15 is a schematic plan view of a modification of the shape of a bank.

Referring to FIG. 15, a bank 75 forms rectangular openings 76 with long and short sides. The bank 75 differs from the bank 34 of the first embodiment in that straight lines 77 and 78 are formed on the long and short sides, respectively, and that arcs 79 are formed at the corners between the straight lines 77 and 78. In short-side regions, including arc 79 regions of the openings 76, the first lower bank segment 41, the second lower bank segment 42, and the upper bank segment 43 are stacked in the form of steps in the above order from the glass substrate 13 side. In long-side regions, the first lower bank segment 41 and the upper bank segment 43 are stacked in the form of steps in the above order from the glass substrate 13 side. The structure of the lower bank segments 46 is not limited to the above structure, and the structures of the lower bank segments 46 shown in the second to fourth embodiments and the first modification may be applied to the bank 75. Alternatively, the two lower bank segments 46 (41 and 42) may be formed only in the arc 79 regions, or they may be formed only in part of the arc 79 regions. With the bank 75, at least the arc 79 regions, which are not readily filled with a functional liquid, can be filled with a functional liquid.

Figure 16:
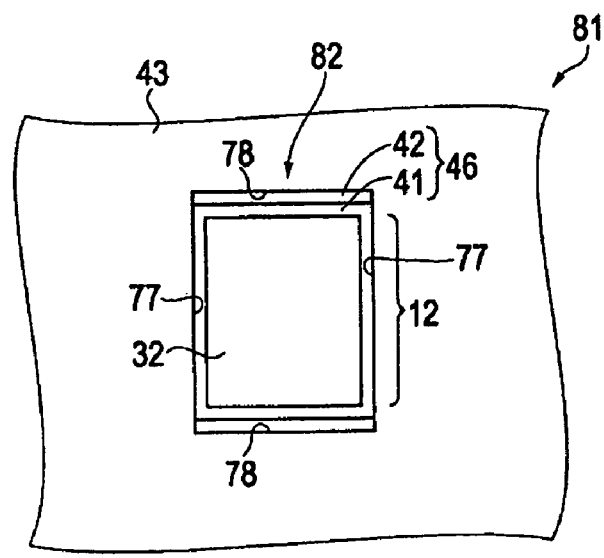
FIG. 16 is a schematic plan view of another modification of the shape of a bank.

Referring to FIG. 16, a bank 81 forms rectangular openings 82 with long and short sides. The bank 81 differs from the bank 75 shown in FIG. 15 in that the corners are not arc-shaped. In short-side regions of the openings 82, the first lower bank segment 41, the second lower bank segment 42, and the upper bank segment 43 are stacked in the form of steps in the above order from the glass substrate 13 side. In long-side regions, the first lower bank segment 41 and the upper bank segment 43 are stacked in the form of steps in the above order from the glass substrate 13 side. The structure of the lower bank segments 46 is not limited to the above structure, and the structures of the lower bank segments 46 shown in the second to fourth embodiments and the first modification may be applied to the bank 81. Alternatively, the two lower bank segments 46 (41 and 42) may be formed in regions including part of the corners. With the bank 81, at least the corners, which are not readily filled with a functional liquid, can be filled with a functional liquid.

Figure 17:
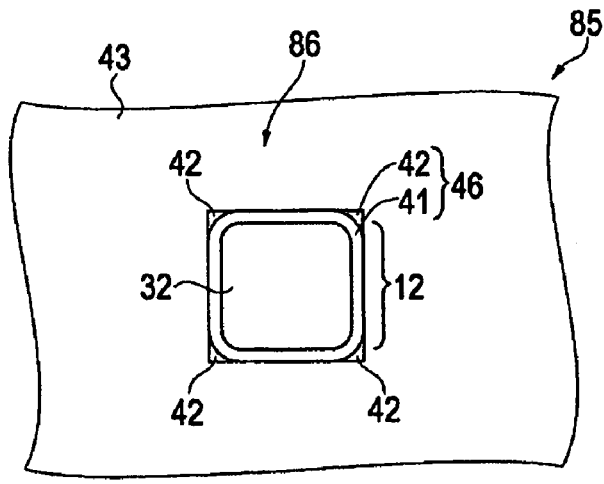
FIG. 17 is a schematic plan view of another modification of the shape of a bank.

Referring to FIG. 17, a bank 85 differs from the bank 81 shown in FIG. 16 in that all sides of openings 86 have the same length (square). In corner regions of the openings 86, the first lower bank segment 41, the second lower bank segment 42, and the upper bank segment 43 are stacked in the form of steps in the above order from the glass substrate 13 side. In the other region, the first lower bank segment 41 and the upper bank segment 43 are stacked in the form of steps in the above order from the glass substrate 13 side. The structure of the lower bank segments 46 is not limited to the above structure, and the structures of the lower bank segments 46 shown in the second to fourth embodiments and the first modification may be applied to the bank 85. Alternatively, the two lower bank segments 46 (41 and 42) may be formed in regions including part of the corners. With the bank 85, at least the corners, which are not readily filled with a functional liquid, can be filled with a functional liquid. In the above openings of various shapes, the lower bank segments 46 do not have to be formed in portions that have sufficient lyophilicity (or portions that have similar lyophilicity) even if their liquid repellency is not decreased.

Third Modification

Although the first lower bank segment 41 or the second lower bank segment 42 is not formed under the upper bank segment 43 in the straight line 45 regions in the second and fourth embodiments, at least one of the first lower bank segment 41 and the second lower bank segment 42 may be formed so as to cover the peripheries of the pixel electrodes 32 without being exposed in the openings 35. This ensures insulation between the pixel electrodes 32.

Fourth Modification

The lower bank segments 46, as described above, do not have to be composed of the first lower bank segment 41 and the second lower bank segment 42. For example, the upper bank segment 43 may be composed of a larger number of segments. In addition, it is preferable to determine whether the first lower bank segment 41 or the first lower bank segment 41, or both, is exposed on the basis of, for example, insulation, ease of ink filling, and compatibility with surface treatment.

Fifth Modification

The first lower bank segment 41 and the second lower bank segment 42, as described above, do not have to be separately formed by patterning. For example, the first lower bank segment 41, formed of a silicon oxide film, and the second lower bank segment 42, formed of a silicon nitride film, may be formed by etching the two films so that they form steps based on their difference in etching rate.

Sixth Modification

The second lower bank segment 42, as described above, does not have to be formed of a silicon nitride film. For example, a material with high dielectric constant, such as tantalum oxide or magnesium oxide, may be used.

Seventh Modification

The method for filling the light-emitting regions 12 with a functional liquid, as described above, is not limited to droplet ejection. For example, dispenser coating may be used.

Eighth Modification

Examples of electrooptical devices, as described above, are not limited to the organic EL devices 11 and 91. This invention may be applied to various electrooptical devices produced by a process involving a step of filling openings of a bank with ink (liquid), including liquid crystal devices with color filters, plasma displays, and electronic paper.

Ninth Modification

Figure 18B:
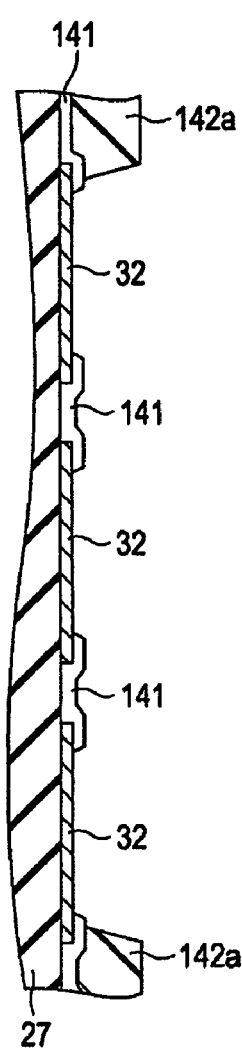
FIGS. 18A to 18C are schematic diagrams of another modification of the shape of a bank.
Figure 18A:
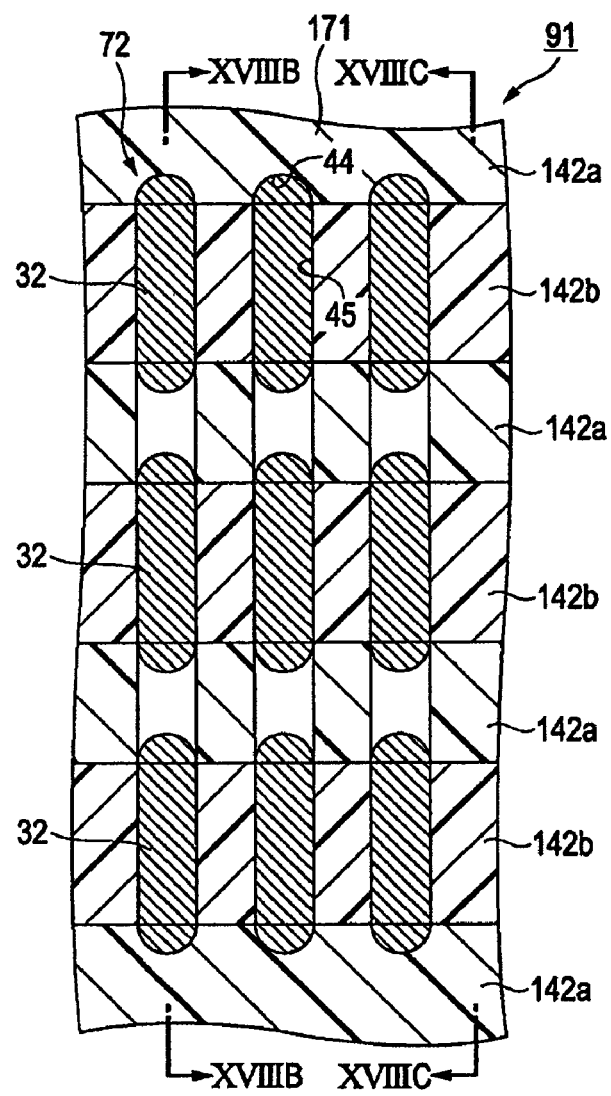
Figure 18C:
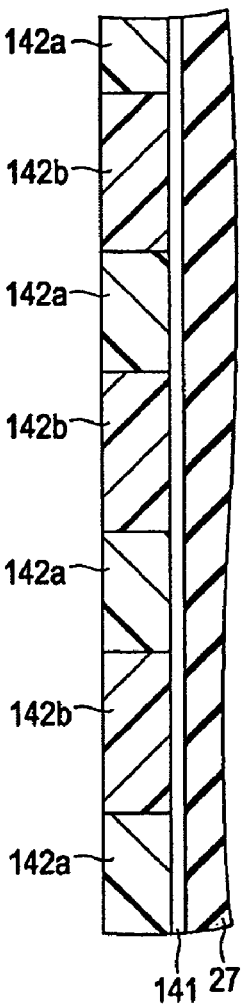

The shapes of the openings 35 of the bank 34 of the fifth to seventh embodiments are not limited to a track shape in plan view; for example, the shapes shown in FIGS. 18A to 18C to 21 may be employed. A bank 171 shown in FIGS. 18A to 18C is a common bank that partitions pixel regions, each including a plurality of light-emitting elements. The second bank segment 142 of the bank 171 includes second portions 142b that are adjacent to the light-emitting regions 12 (including the straight line 45 portions) and that have a higher liquid repellency, with the other region (including the arc 44 portions) being first portions 142a that have a lower liquid repellency. With the bank 171, because the arc 44 portions around the openings 72 are the first portions 142a, which have a lower liquid repellency, a functional liquid (for example, the functional liquids for the light-emitting layers 52) deposited on the first portions 142a can be prevented from receding. In addition, because the straight line 45 portions around the openings 72 are the second portions 142b, which have a higher liquid repellency, the functional liquid can be prevented from spilling out of the openings 72. Furthermore, because the bank 171 includes the second portions 142b, which do not include the arc 44 portions, they can prevent failure to fill the light-emitting regions 12 with a sufficient amount of functional liquid. The light-emitting regions 12 can therefore achieve uniform light-emission characteristics.

Figure 19:
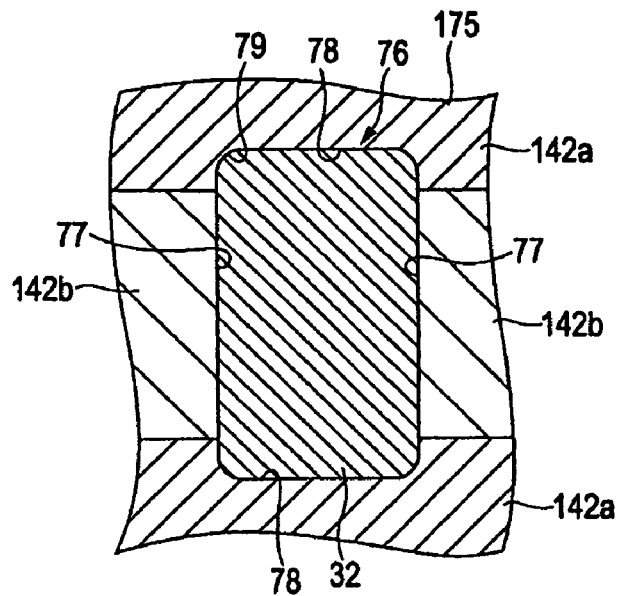
FIG. 19 is a schematic plan view of another modification of the shape of a bank.

Referring to FIG. 19, a bank 175 forms rectangular openings 76 with long and short sides. The bank 175 differs from the bank 34 of the fifth embodiment in that straight lines 77 and 78 are formed on the long and short sides, respectively, and that arcs 79 are formed at the corners between the straight lines 77 and 78. The second bank segment 142 of the bank 175 includes, for example, first portions 142a that include arc 79 portions and second portions 142b that do not include the arc 79 portions. In this case, because the short-side portions around the openings 76 are the first portions 142a, having a lower liquid repellency, the short-side regions, which are not relatively readily filled with liquid, can be filled with a functional liquid. In addition, because the long-side portions around the openings 76 are the second portions 142b, having a higher liquid repellency, the functional liquid can be prevented from spilling out of the long-side regions. The structure used is not limited to the above structure. For example, it is possible that only the arc 79 portions, which do not include the straight line 77 portions or the straight line 78 portions, be the first portions 142a and the other portions be the second portions 142b. It is also possible that portions including part of the corners be the first portions 142a and the other portions be the second portions 142b. With the bank 175, at least the arc 79 portions, which are not readily filled with a functional liquid, can be filled with a functional liquid.

Figure 20:
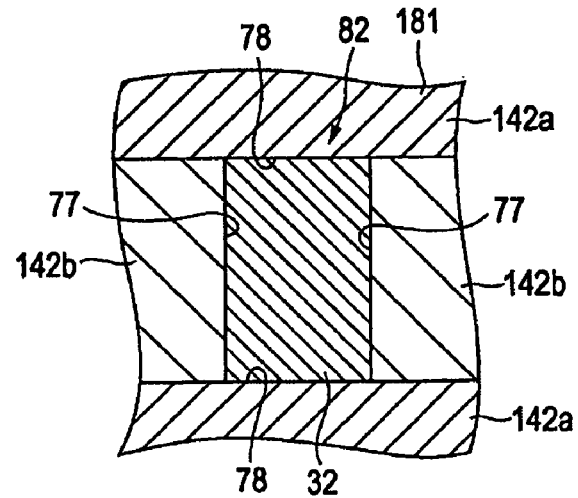
FIG. 20 is a schematic plan view of another modification of the shape of a bank.

Referring to FIG. 20, a bank 181 forms rectangular openings 82 with long and short sides. The bank 181 differs from the bank 175 shown in FIG. 19 in that the corners are not arc-shaped. The second bank segment 142 of the bank 181 includes, for example, the first portions 142a on the short sides of the openings 82 (on the straight line 78 sides) and the second portions 142b on the long sides of the openings 82 (on the straight line 77 sides). The structure used is not limited to the above structure. For example, it is possible that the corners and their vicinities be the first portions 142a and the other portions be the second portions 142b. It is also possible that portions including part of the corners be the first portions 142a and the other portions be the second portions 142b. With the bank 181, because the corners are not arc-shaped, the openings 82 can be filled with a functional liquid over a larger area to provide uniform light-emission characteristics in the light-emitting regions 12, although the entire light-emitting regions 12 may be less easily filled with a functional liquid. In addition, the bank 181 provides larger light-emitting regions than a bank with arc-shaped corners.

Figure 21:
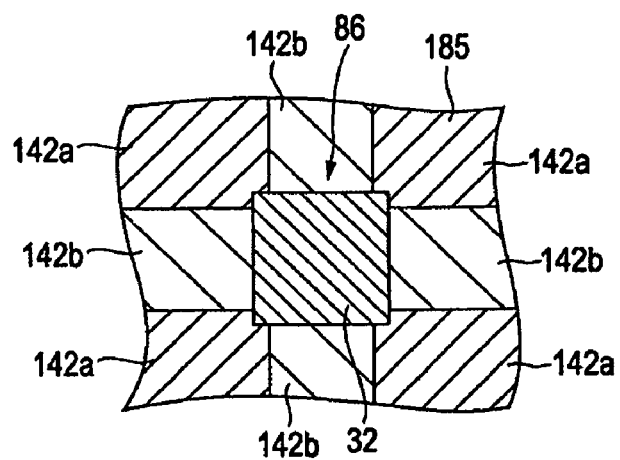
FIG. 21 is a schematic plan view of another modification of the shape of a bank.

Referring to FIG. 21, a bank 185 differs from the bank 181 shown in FIG. 20 in that all sides of openings 86 have the same length (square). The bank 185 includes, for example, the first portions 142a at the corners of the openings 86 and their vicinities and the second portions 142b in the other portions. With the bank 185, the corners, which are not readily filled with a functional liquid, can be readily filled with a functional liquid because they have a lower liquid repellency. In the above openings of various shapes, a treatment for decreasing liquid repellency does not have to be performed on portions that have sufficient lyophilicity (or portions that have similar lyophilicity) even if their liquid repellency is not decreased.

Tenth Modification

The method for forming the first portions 142a and the second portions 142b is not limited to those of the fifth to seventh embodiments. For example, the second portions 142b may be roughened to a wavy or serrated surface by a method such as cutting or deformation to increase the liquid repellency of the second portions 142b.

The entire disclosure of Japanese Patent Application Nos. 2007-190434, filed Jul. 23, 2007 and Nos. 2007-190437, filed Jul. 23, 2007 are expressly incorporated by reference herein.

What is claimed is:

1. An electrooptical device having a plurality of light-emitting regions, comprising:
   a substrate;
   a bank disposed in a region other than the light-emitting regions on the substrate so as to surround the light-emitting regions; and
   a functional layer disposed in openings surrounded by the bank;
   wherein the bank includes an upper bank segment and a plurality of lower bank segments having a higher wettability than the upper bank segment; and the number of the lower bank segments exposed is smaller in second regions of the openings than in first regions of the openings.

2. The electrooptical device according to claim 1, wherein the openings have corners as viewed in a normal direction; and the first regions are regions including part of the corners of the openings.

3. The electrooptical device according to claim 1, wherein the openings have arcs as viewed in a normal direction; and the first regions are regions including part of the arcs of the openings.

4. The electrooptical device according to claim 1, wherein the openings have long sides and short sides as viewed in a normal direction;

the first regions are regions on the short sides of the openings; and the second regions are regions on the long sides of the openings.

5. The electrooptical device according to claim 1, wherein the lower bank segments include, in order from the substrate side, a first lower bank segment and a second lower bank segment; and the second lower bank segment has a smaller contact angle with liquid than the first lower bank segment.

6. The electrooptical device according to claim 5, wherein the first lower bank segment is a silicon oxide film; and the second lower bank segment is a silicon nitride film.

7. The electrooptical device according to claim 5, wherein the second lower bank segment is exposed in the first regions.

8. The electrooptical device according to claim 5, wherein the first and second lower bank segments are exposed in the first regions; and one of the first and second lower bank segments is exposed in the second regions.

9. An electrooptical device having a plurality of light-emitting regions, comprising:

a substrate;

a bank disposed in a region other than the light-emitting regions on the substrate so as to surround the light-emitting regions; and a functional layer disposed in openings surrounded by the bank;

wherein the bank includes an upper bank segment and a lower bank segment having a higher wettability than the upper bank segment; and the lower bank segment is exposed in first regions of the openings but is not exposed in second regions of the openings.

10. The electrooptical device according to claim 1, further comprising:

pixel electrodes, corresponding to the individual light-emitting regions, disposed on a surface of the substrate; and a common electrode disposed opposite the pixel electrodes with the functional layer disposed therebetween;

wherein the functional layer at least includes a light-emitting layer.

11. An electronic apparatus comprising the electrooptical device according to claim 1.

* * * * *